(12) United States Patent
Fan et al.

(10) Patent No.: US 11,923,873 B2
(45) Date of Patent: Mar. 5, 2024

(54) APPARATUSES AND METHODS INVOLVING DC VOLTAGE CONVERSION USING PHOTONIC TRANSFORMERS

(71) Applicant: The Board of Trustees of the Leland Stanford Junior University, Stanford, CA (US)

(72) Inventors: Shanhui Fan, Stanford, CA (US); Bo Zhao, Menlo Park, CA (US); Sid Assawaworrarit, Redwood City, CA (US); Parthiban Santhanam, Redwood City, CA (US); Meir Orenstein, Haifa (IL)

(73) Assignee: The Board of Trustees of the Leland Stanford Junior University, Stanford, CA (US)

( * ) Notice: Subject to any disclaimer, the term of this patent is extended or adjusted under 35 U.S.C. 154(b) by 77 days.

(21) Appl. No.: 17/541,521

(22) Filed: Dec. 3, 2021

(65) Prior Publication Data
US 2022/0182070 A1 Jun. 9, 2022

Related U.S. Application Data

(60) Provisional application No. 63/121,703, filed on Dec. 4, 2020.

(51) Int. Cl.
*H03M 1/00* (2006.01)
*H03M 1/66* (2006.01)
*H03M 7/00* (2006.01)

(52) U.S. Cl.
CPC ............. *H03M 7/008* (2013.01); *H03M 1/66* (2013.01)

(58) Field of Classification Search
CPC .......... H03M 7/008; H03M 1/66; H02M 3/04; H02J 50/30
See application file for complete search history.

(56) References Cited

U.S. PATENT DOCUMENTS

| | | | | |
|---|---|---|---|---|
| 4,124,860 A | * | 11/1978 | Johnson | H01L 31/167 257/E31.108 |
| 9,991,403 B2 | * | 6/2018 | Charlton | H01L 31/055 |
| 11,005,413 B2 | * | 5/2021 | Karalis | H01L 31/04 |
| 2012/0112165 A1 | * | 5/2012 | Charlton | H01L 33/505 257/21 |
| 2013/0206219 A1 | * | 8/2013 | Kurtin | H01L 31/048 136/255 |
| 2013/0278064 A1 | | 10/2013 | Turqueti | |

(Continued)

OTHER PUBLICATIONS

Wilkins, M.M. et al. Ripple-free boost-mode power supply using photonic power conversion. IEEE Trans. Power Electron. 34, 1054-1064 (2019).

(Continued)

*Primary Examiner* — Jean B Jeanglaude
(74) *Attorney, Agent, or Firm* — Crawford Maunu PLLC

(57) ABSTRACT

In certain examples, methods and semiconductor structures are directed to an apparatus including a photon emitter such as an LED which operates over an emission wavelength range and a photo-voltaic device arranged relative to the photon emitter to provide index-matched optical coupling between the photo-voltaic device and the photon emitter for an emission wavelength range of the photon emitter.

20 Claims, 10 Drawing Sheets

(56) References Cited

U.S. PATENT DOCUMENTS

2015/0171251 A1* 6/2015 Rotschild ............... H01S 3/091
372/75
2018/0131311 A1* 5/2018 Karalis ........... H01L 31/022425

OTHER PUBLICATIONS

Ishigaki, M. et al. A new optically-isolated power converter for 12 V gate drive power supplies applied to high voltage and high speed switching devices. In: 2017 IEEE Applied Power Electronics Conference and Exposition (APEC) (2017). Abstract Only.
Zhao, B. & Fan, S. Chemical potential of photons and its implications for controlling radiative heat transfer. Annual Review of Heat Transfer 22, 32934 (2020), Chapter 10, 397-431.
Chen, K., Zhao, B. & Fan, S. Mesh: A free electromagnetic solver for far-field and near-field radiative heat transfer for layered periodic structures. Comput. Phys. Commun. 231, 163-172 (2018).
Zhao, B. et al. Self-sustaining thermophotonic circuits. Proc. Natl. Acad. Sci. 116, 11596-11601 (2019).
Watjen, J.I., Zhao, B. & Zhang, Z.M. Near-field radiative heat transfer between doped-Si parallel plates separated by a spacing down to 200 nm. Appl. Phys. Lett. 109, 203112 (2016).
Santhanam, P. et al. Room temperature thermo-electric pumping in mid-infrared light-emitting diodes. Appl. Phys. Lett. 103, 183513 (2013).
Sadi, T., Radevici, I. & Oksanen, J. Thermophotonic cooling with light-emitting diodes. Nat. Photonics 14, 205-214 (2020).
Pau, S., Bjork, G., Jacobson, J. & Yamamoto, Y. Fundamental thermodynamic limit of laser efficiency. IEEE J. Quantum Electron. 32, 567-573 (1996). Abstract Only.
Chen, K. et al. High-performance near-field electroluminescent refrigeration device consisting of a gaas light emitting diode and a si photovoltaic cell. J. Appl. Phys. 122, 143104 (2017).

* cited by examiner

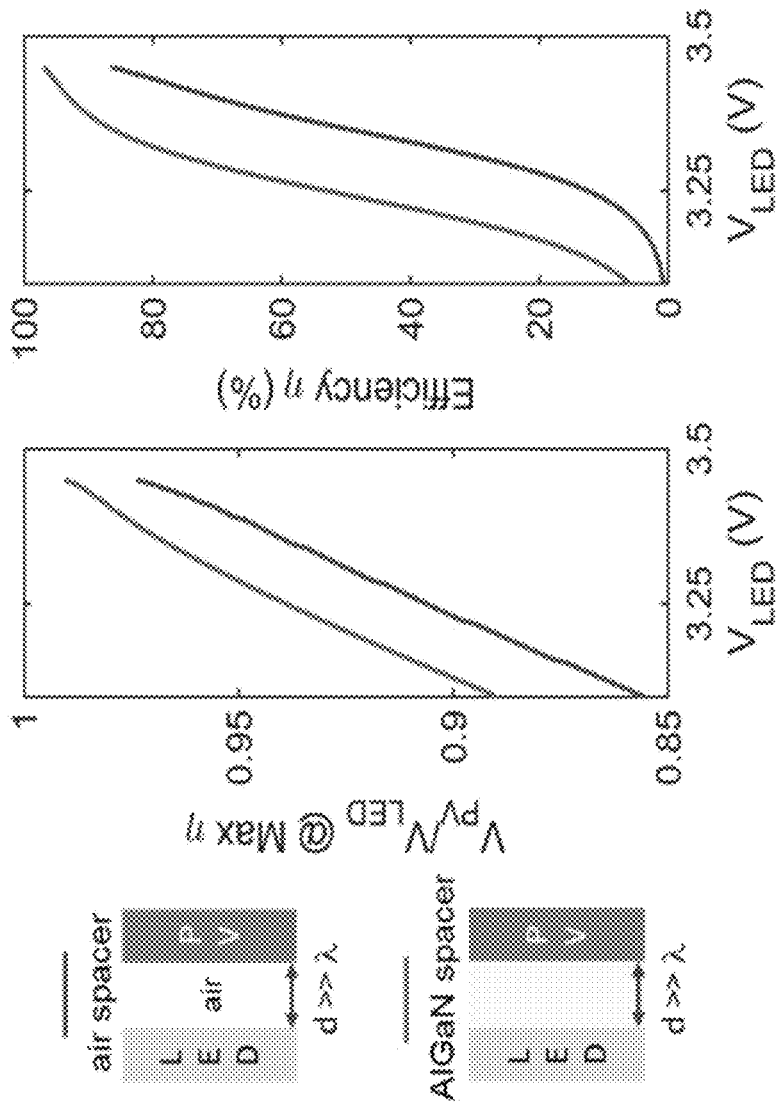
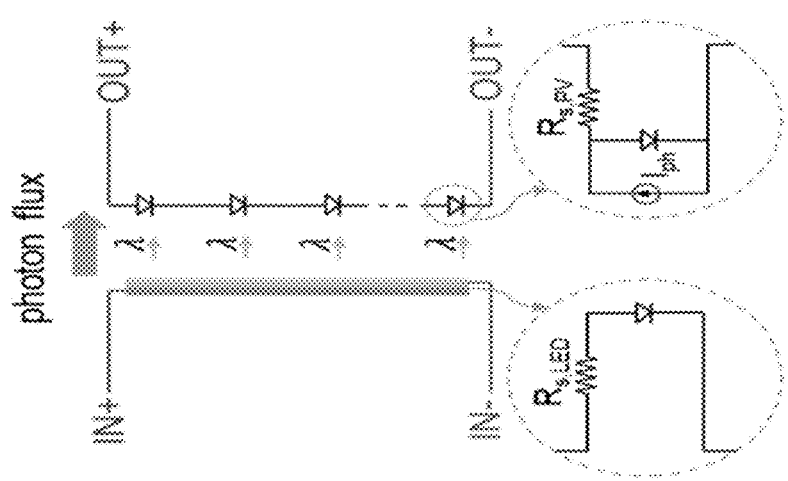
FIG. 1C
FIG. 1D

APPARATUSES AND METHODS INVOLVING DC VOLTAGE CONVERSION USING PHOTONIC TRANSFORMERS

FEDERALLY-SPONSORED RESEARCH AND DEVELOPMENT

This invention was made with Government support under contract W911NF-19-1-0279 awarded by the U.S. Army Research Laboratory, under contract N00014-17-1-3030 awarded by the Department of Defense, and under contract DE-SC0019140 awarded by the Department of Energy. The Government has certain rights in the invention.

BACKGROUND

Aspects of the present disclosure are related generally to the field of direct current (DC) converters.

Using one such technology type for ease of discussion, it has been appreciated that voltage conversion plays an important role in many electronic circuits, matching the voltage level of the power source to various voltage levels required by different subcircuits. In certain electrical and/or electronic systems, for example, voltage conversion bridges the gap between the voltage requirements of the power source/generation, distribution, and individual loads on the circuit. As with the transformer of FIG. 1A as commonly used in electrical power distribution networks, an alternating-current (AC) voltage is converted to another using the principle of magnetic induction: the alternating magnetic flux in the transformer core links together the input voltage on the primary winding and the voltage across the secondary winding, with the voltage conversion ratio determined by the winding ratio between the two coils.

Similar to the role of AC voltage transformer in electrical power networks, direct-current (DC) voltage conversion is important in electronics, since the majority of electronic devices rely on DC power. Existing DC voltage conversion often relies on switch-mode converters, as shown by in FIG. 1B by way of a step-up or boost-mode converter which relies on switch-mode operation wherein energy is periodically stored within and released from inductors and/or capacitors connected in a variety of circuit topologies.

The core building blocks of these converters are intermediate energy storage elements (inductors and capacitors), and switching elements (e.g., transistors and diodes) that are temporally modulated to charge and discharge the energy storage elements. The charging and discharging can occur at different voltage levels, as determined by the switch duration (i.e., duty cycle), thus allowing the converters to provide a range of output DC voltage levels to suit the various loads. Due to the difficulty of scaling down efficient inductors, switching converters usually take up substantial real estate on-chip or on the circuit board and therefore represent a major obstacle in miniaturizing electronic devices. Moreover, the switching action in these switch-mode converters inevitably produces fluctuating internal voltages and currents with significant detrimental effects manifested as (i) output voltage ripples due to constant cycling between charging and discharging of the output capacitor, (ii) outgoing electromagnetic radiation from switching current flows that are often the major source of electromagnetic interference (EMI), and (iii) acoustic noise via coupling to mechanical vibrations. These "switching" noises deteriorate the local electromagnetic environment and contaminate connected power buses by causing interference between electronic equipment and systems. It has been a long-standing challenge to minimize the switching noise of DC power electronics to improve the electromagnetic compatibility and the quality of electrical power in power networks. Coupled with the miniaturization trend that crowds circuits into ever tighter space, the interference issues become harder to mitigate and more severe.

While attempts to overcome such challenges have been attempted by various types of DC voltage transformation, their experimentally-demonstrated efficiencies and voltage conversion ratios are significantly below that of the standard type of switch-mode voltage converter.

Accordingly, these and other matters have presented challenges to implementations of circuit-based systems, device and methods for a variety of applications.

SUMMARY OF VARIOUS ASPECTS AND EXAMPLES

Various examples/embodiments presented by the present disclosure are directed to issues such as those addressed above and/or others which may become apparent from the following disclosure. For example, some of these disclosed aspects are directed to methods and devices that use or leverage from photon-emission and reabsorption processes associated with use of a photo-emitter (e.g., a light-emitting diode or LED) and a photo-voltaic cell (e.g., component or device).

In one specific example, an apparatus and/or method involves a photon emitter, a photo-voltaic cell, the photo-voltaic cell being arranged relative to the photon emitter to provide index-matched optical coupling between the photo-voltaic cell and the photon emitter for an emission wavelength range of the photon emitter. These aspects may be arranged as a photonic transformer to realize DC voltage conversion.

In other specific examples, a method and/or a semiconductor device involves a photon emitter (e.g., an LED), a photo-voltaic cell, and a spacing structure or material ("spacer") is located between the photon emitter and the photo-voltaic cell such that during operation, the photon emitter and the photo-voltaic cell are optically coupled. The spacer, which may include an index matching material and may be integrated with or as part of structure forming the spacer, is preferably predominantly transparent in an emission wavelength range in which the photon emitter operates. In this manner, the photon emitter and a photo-voltaic (PV) device (including or referring to a structure with one or more PV cells) may be arranged as a photonic transformer to realize DC voltage conversion (e.g., through photon-emission and reabsorption processes).

In certain other examples which may also build on the above-discussed aspects, methods and semiconductor structures are directed to the spacer including a first material that is transparent in the emission wavelength range of a second material used in the photoemitter, wherein each of the first material and the second material are part of a materials system as characterized by similar or corresponding refractive indexes associated with each of the first material and second material.

In a further specific example, the first material and the second material need not be part of the same materials system. More specifically, the spacer may be configured as a material-based layer, with the layer including a first material that is among different materials in a materials system each of said different materials characterized by a similar or corresponding refractive index, wherein the first material is related to another material that is not among the different materials in the materials system in that the first material is essentially or substantially transparent in the emission wavelength range of the other material and in that the first material and the other material are related by way of a similar or corresponding refractive index.

In more specific examples related to the above methodology and/or devices, the first material and the second material are characterized by one of the following: the first and second materials refer to or include AlGaN and GaN; the first and second materials refer to or include InP and InGaAs; and the first and second materials refer to or include AlGaAs and GaAs.

According to another aspect, the present disclosure is directed to a method of use and/or manufacture, wherein the method involves a photon emitter and a PV device being arranged relative to one another for providing index-matched optical coupling, for an emission wavelength range of the photon emitter, between the PV device and the photon emitter. The photon emitter is activated (e.g., via an input voltage) to emit photons and the PV device responds by generating electric current.

The above discussion is not intended to describe each aspect, embodiment or every implementation of the present disclosure. The figures and detailed description that follow also exemplify various embodiments.

BRIEF DESCRIPTION OF FIGURES

Various example embodiments, including experimental examples, may be more completely understood in consideration of the following detailed description in connection with the accompanying drawings, in which:

FIGS. 1C-1G shows examples of various transformer circuitry in accordance with the present disclosure, with FIGS. 1C and 1D respectively showing photonic-transformer configuration and charted theoretical performance data, FIG. 1E showing a chart with efficiency plotting for a maximum possible efficiency, FIG. 1F showing modeled photonic transformer performance, and FIG. 1G showing a monolithic design of a photonic transformer (also in accordance with examples of the present disclosure);

Also in accordance with the present disclosure.

Also according circuitry to the present disclosure.

Figures 1A, 1B:
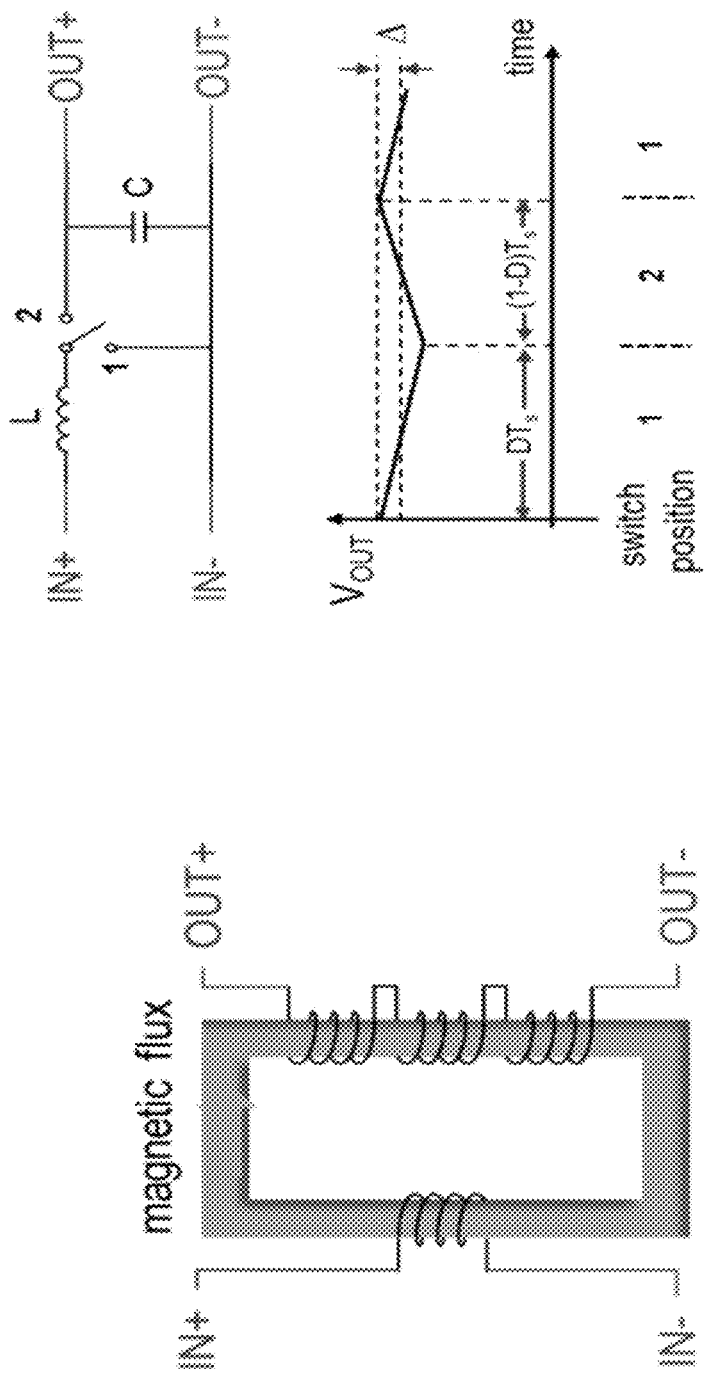
FIGS. 1A-1B show various transformer circuitry with FIGS. 1A and 1B respectively showing schematics of a known transformer and a step-up converter.

While various embodiments discussed herein are amenable to modifications and alternative forms, aspects thereof have been shown by way of example in the drawings and will be described in detail. It should be understood, however, that the intention is not to limit the disclosure to the particular embodiments described. On the contrary, the intention is to cover all modifications, equivalents, and alternatives falling within the scope of the disclosure including aspects defined in the claims. In addition, the term "example" as used throughout this application is only by way of illustration, and not limitation.

DETAILED DESCRIPTION

Aspects of the present disclosure are believed to be applicable to a variety of different types of apparatuses (e.g., systems, devices, components, etc.) and methods involving circuitry for DC voltage conversion using photonic transformers based on light-emitting diodes and in specific examples with such circuitry being scalable and/or implemented via monolithically-based design. While the following discussion refers to specific examples of such circuitry in apparatuses and methods of use and of manufacture/assembly, such discussion is provided merely in an exemplary context to help explain such aspects, and the present disclosure is not necessarily so limited. While the present disclosure is not necessarily limited to such aspects, an understanding of specific examples in the following description may be understood from discussion in such specific contexts.

Accordingly, in the following description various specific details are set forth to describe specific examples presented herein. It should be apparent to one skilled in the art, however, that one or more other examples and/or variations of these examples may be practiced without all the specific details given below. In other instances, well known features have not been described in detail so as not to obscure the description of the examples herein. For ease of illustration, the same connotation and/or reference numerals may be used in different diagrams to refer to the same elements or additional instances of the same element. Also, although aspects and features may in some cases be described in individual figures, it will be appreciated that features from one figure or embodiment can be combined with features of another figure or embodiment even though the combination is not explicitly shown or explicitly described as a combination.

Exemplary aspects of the present disclosure are related to DC voltage conversion, for example as a photonic transformer, which includes a photon emitter and one or more photo-voltaic cells. In certain specific examples, the PV device photo-voltaic cell(s) are arranged relative to the photon emitter to provide index-matched optical coupling between the photo-voltaic cell(s) and the photon emitter for an emission wavelength range of the photon emitter, and/or one such photo-voltaic cell is arranged relative to the photon emitter with a spacer material located between the photon emitter and the photo-voltaic cell such that optical coupling is provided for the photon emitter and the photo-voltaic cell with the spacer material being predominantly transparent in the emission wavelength range of the photon emitter.

In methods related to the above types of apparatuses, with the photon emitter and the photo-voltaic cells being in such an optically-coupled arrangement, energy (e.g., a voltage) may be applied to cause the photon emitter to emit photons and the photo-voltaic cells to respond by generating electric current. In such methods, the photon emitter and the photo-voltaic cells act as a photonic transformer and thereby provide DC voltage conversion (e.g., through photon-emission and reabsorption processes).

Certain exemplary embodiments may be understood in a context with such a spacer material located between the photon emitter and the photo-voltaic cells. In this context, one type of example has the spacer material including a first material that is transparent in the emission wavelength range of a second material used in the photon emitter, wherein each of the first material and the second material are part of a materials system as characterized by similar or corresponding refractive indexes associated with each of the first material and second material. In more specific examples, the first material and the second material are characterized by one of the following: the first and second materials refer to or include AlGaN and GaN; the first and second materials refer to or include InP and InGaAs; and the first and second materials refer to or include AlGaAs and GaAs. In other examples, the materials system includes at least one of the following sets of different materials: (a) AlGaN and GaN; (b) InP and InGaAs; (c) AlGaAs and GaAs, and in further examples at least one of the photon emitter and the photovoltaic cell includes at least one of the following materials: GaN; AlGaN; InGaAs; InP; GaAs; and AlGaAs.

In yet other such examples, the first material and the second material need not be part of the same materials system. More specifically, the spacer may be configured as a material-based layer, with the layer including a first material that is among different materials in a materials system each of said different materials characterized by a similar or corresponding refractive index, wherein the first material is related to another material that is not among the different materials in the materials system in that the first material is essentially or substantially transparent in the emission wavelength range of the other material and in that the first material and the other material are related by way of a similar or corresponding refractive index.

In other example embodiments according to the present disclosure, such a photonic transformer has index-matching material integrated in or against one or both of the inner-facing opposing inner surfaces, respectively, of the photoemitter and of the PV device (with or without another spacer structure separating the LED and PV).

Consistent with the above aspects, such a manufactured device or method of such manufacture may involve aspects presented and claimed in U.S. Provisional Application Ser. No. 63/121,703 filed on Dec. 4, 2020 (STFD.427P1) and with Appendices, to which priority is claimed. To the extent permitted, such subject matter is incorporated by reference in its entirety generally and to the extent that further aspects and examples (such as experimental and/more-detailed embodiments) may be useful to supplement and/or clarify.

According to certain specific example embodiments and aspects, the present disclosure is directed to DC voltage conversion using photonic transformers based on light-emitting diodes. In certain example embodiments, aspects of the present disclosure involve a design in which coupling is provided between the input and output ports of a photonic transformer, and thereby enabling efficient DC-DC conversion using photons, and with efficiencies that are much higher than previously-known efforts and comparable with convectional switching-mode converters. In certain example implementations, the coupling is achieved with an index matching layer in a highly scalable monolithic design (and thus facilitating miniaturization and integration as may be needed).

In one particular example, the present disclosure is directed to methods of manufacture (e.g., semiconductor fabrication generally, more specific types of thin-film semiconductor fabrication (e.g., involving flexible substrates) and/or assembly of components) and methods of use directed to DC voltage conversion using photonic transformers based on light-emitting diodes (LEDs as photon emitters) in an apparatus or method involving or including an LED and one or more PV cells such as in a PV device, and a spacer material (also referred to as a spacer or material-based layer) between the LED and the PV cells, wherein the spacer includes an index matching material that is essentially transparent in the emission wavelength range of the index matching material. In more particular examples, the apparatus may include an LED and PV device, with the spacer material between the LED and the PV cells, wherein the spacer material includes AlGaN (e.g., being essentially transparent in the emission wavelength range of GaN and having a refractive index $n_{AlGaN}$ similar to that of GaN).

In yet other specific examples and as shown experimentally, the present disclosure is directed to a particular type of non-switching photonic transformer for DC voltage conversion, using photovoltaic cells and light-emitting diodes. Relative to photovoltaic cells and lasers in which conversion efficiency is intrinsically limited by the efficiency of lasers, the particular type of non-switching photonic transformer is a light-emitting diode based transformer that does not have such efficiency limitation and rather can leverage from the efficiency of light-emitting diodes and thereby provide electrical to optical power conversion with an efficiency approaching and/or greater than 100%. In related and even more-specific examples of this particular type, the transformer does not contain switching components and does not produce any switching noise (e.g., ensuing from switching components and/or operation of any other components). In certain further specific examples, the circuit can be also made very compact and even monolithically integrate; and with affordable high-quality semiconductors and efficient photon transport enabled by an index-matching layer, the photonic transformer can operate with a near-unity conversion efficiency and high voltage conversion ratio. Findings based on such experimental work confirm that such examples provide a high-performance optical solution to miniaturizing DC power converters for electronics and improving the electromagnetic compatibility and quality of electrical power.

As noted above, certain example embodiments according to the present disclosure are directed to a photonic approach for voltage conversion involving a photonic-transformer configuration that does not require switching mechanisms and/or energy storage elements for providing its basic voltage conversion operation (e.g., if desirable to miniaturize, to remove switching noise, reduce component count, and/or reduce real estate). FIG. 1C illustrates this type of circuit by way of an example circuit diagram as applied to a voltage step-up operation.

More specifically, FIG. 1C is a schematic that shows an example DC photonic transformer according to the present disclosure. The photon flux emitted by the LED and received by the PV cell(s) act as a current source for the external load of the PV cell. The inset shows the series resistances of the PV cells and LED. Further, FIG. 1C shows a light-emitting diode (LED), powered by a DC power supply, emits photons that are received by an array of photovoltaic (PV) cells (i.e., photodiodes operating in the PV mode) which are connected in series. By applying a voltage bias, the LED converts the input power to emitted photons that are subsequently absorbed by the PV cells, generating a voltage due to the photovoltaic effect. The PV cells are connected in series such that the total output voltage is the additive voltage from all the PV cells. Thus, a given voltage input to the LED can be boosted to a larger predetermined voltage. Here the term 'photonic transformer' is used for such a device to highlight the similarity with that of a conventional transformer (FIG.

1A) in that both devices aim to transform voltages, and the input and output ports are electrically isolated. On the other hand, in contrast to previous conventional transformers in which the input and output ports are mediated by AC magnetic flux, the exemplary photonic transformers according to the present disclosure use spontaneous emission and detection of photons to transport energy and achieve voltage transformation, and operate with DC voltages.

In connection with certain experimental example constructs which use a detailed balance analysis, the following discussion shows that the efficiency of a photonic transformer, of the type constructed as exemplified herein, can approach unity. The key to such high efficiency is to achieve highly efficient optical coupling between the LED and the PV cells. For example, according to the present disclosure, a monolithic design is provided where such a strong optical coupling between the LED and the PV cell can be achieved. Based on such a constructed photonic transformer consisting of off-the-shelf components, and experiments perform on the same, the agreement between experiments and theory provides a validation of this theoretical formalism according to examples of the present disclosure; even using such relatively inefficient off-the-shelf components, large voltage conversion ratios (e.g., greater than 40) are realized and such performance significantly exceeds what has been previously demonstrated in existing experiments on previous photonic transformers (less than 10).

To derive the theoretical performance limit of a photonic transformer according to the present disclosure, an analysis is performed on the setup in FIG. 1C with one LED facing N identical PV cells. For planar LED and PV cells, when N is large, one can reasonably assume the view factors from the LED to each PV cell, $f_{LED \to PV}$, are the same. In this case, each PV cell receives the same amount of illumination from the LED, and therefore generates the same voltage. The voltage (current) of the LED and each PV cell is denoted as $V_{LED}$ ($I_{LED}$) and $V_{PV}$ ($I_{PV}$), respectively. Therefore, the input and output voltages are respectively $V_{IN}=V_{LED}$ and $V_{OUT}=NV_{PV}$, when series resistance is negligible. The input and output currents are respectively $I_{IN}=I_{LED}$ and $I_{OUT}=-I_{PV}$. The voltage conversion ratio (W) can be expressed as $$W = \frac{V_{OUT}}{V_{IN}} = N \frac{V_{PV}}{V_{LED}} \quad (1)$$

And the power efficiency ($\eta$) can be obtained as $$\eta = \frac{P_{OUT}}{P_{IN}} = \frac{V_{OUT} I_{OUT}}{V_{IN} I_{IN}} = N \frac{-I_{PV} V_{PV}}{I_{LED} V_{LED}} \quad (2)$$

Equation (1) indicates that the conversion ratio depends on how much voltage each PV cell can recover from the photon flux emitted by the LED. The power efficiency is a product of the voltage conversion ratio and the current conversion ratio ($\approx I_{PV}/I_{LED}$). The voltage and current of the LED and each PV cell can be obtained from the detailed balance relations.

$$[F_{amb \to LED} - F_{LED \to amb}] + \quad (3)$$
$$N[F_{PV \to LED} - F_{LED \to PV}] - R_{LED}(V_{LED}) + \frac{I_{LED}}{q} = 0$$

and $$[F_{amb \to PV} - F_{PV \to amb}] + [F_{LED \to PV} - F_{PV \to LED}] - R_{PV}(V_{PV}) + \frac{I_{PV}}{q} = 0 \quad (4)$$

where $F_{a \to b}$, with a, b=LED, PV, and amb (the ambient), is the photon flux emitted from object a and absorbed by object b, q is the elementary charge, R is the total rate of nonradiative recombination. A sign convention is used such that a positive current flows from the p to the n region internally in each diode. Therefore, for normal operation of the photonic transformer, $I_{LED} \geq 0$ and $I_{PV} \leq 0$. The ambient term includes all objects beyond the active regions of the LED and the PV, so the photon flux absorbed by the ambient represents the photon leakage from the converter, which should be minimized. The photon flux emitted by the ambient usually is much smaller compared to the photon flux emitted by the LED, and therefore can be neglected.

For the setup up in the above panel of FIG. 1C, first consider an ideal scenario where the LED and PV cells have the same bandgap with unity external quantum efficiency (EQE) above the bandgap, which implies that the nonradiative terms in equations (3) and (4) are zero. In this case, the emitted photon flux may be modeled from object a and absorbed by object b as $$F_{a \to b}(V_a) = A_a f_{a \to b} \int_{\omega_g}^{\infty} \frac{\omega^2}{4\pi^2 c^2} \frac{1}{\exp\left(\frac{\hbar \omega - qV_a}{kT}\right) - 1} d\omega \quad (5)$$

In equation (5), a and b denote the LED, PV, $\omega$ is angular frequency, $\omega_g$ is the bandgap frequency, c is the speed of light in vacuum, k is the is the Boltzmann constant, $V_a$ is the voltage applied on object a, and $qV_a$ thus corresponds to the chemical potential of emitted photon. The symbol T is the temperature of the diode, and throughout the paper in the numerical calculations, assume all objects are at room temperature with T=300 K. $A_a$ is the emitting surface area. $f_{a \to b}$ is the view factor from object a to object b. If it is further assumed no photon leakage, then the terms in equations (3) and (4) involving the ambient become zero, and which leads to $A_{LED}=NA_{PV}$, $f_{LED \to PV}=1/N$, and $f_{PV \to LED}=1$. One therefore could obtain $-NI_{PV}=I_{LED}$ based on these equations. Therefore, W=N$\eta$ based on equations (1) and (2), and the maximum efficiency point is when $F_{LED \to PV}=F_{PV \to LED}$ based on equations (3) and (4), i.e., $V_{PV}=V_{LED}$ based on equation (5). In other words, each PV cell at open circuit condition will fully recover the voltage of the LED. In this case, the series-connected PV cell array is in open circuit condition (i.e., $P_{OUT}=0$) and outputs a boosted voltage that is N times the input voltage according to equation (1). Therefore, the conversion ratio of the photonic transformer, according to examples of the present disclosure, depends on the number of PV cells. This dependence allows one to get in principle any desired high conversion ratio by selecting N.

The operation principle of certain photonic transformers according to the present disclosure is fundamentally different from that of conventional transformers or switch-mode converters. The emission process in the LED and absorption process in the PV cell side are quantum processes. In contrast, in traditional transformers (e.g., FIG. 1A) or switch-mode converters (FIG. 1B), the power exchange process can be described entirely classically.

FIG. 1D illustrates theoretical performance of a GaN photonic transformer, according to the present disclosure, with an air gap (also referred to as "air spacer") implementation and also with an AlGaN material (material-based spacer) layer that provides both the optical coupling for the emission wavelength of the LED and electrical insulation. For an analysis of the expected performance of an actual photonic transformer, consider such a photonic transformer with the $Al_{0.5}Ga_{0.5}N$ (spacer) layer as depicted. For practical use, with a finite load resistance, the operation point of the PV cells is by necessity away from the open circuit condition in order to have non-zero output power. Hence the voltage recovery in general will not be complete. The voltage recovery will also be subject to penalties from the nonradiative processes and series resistances in both the LED and PV cells. Here, it is shown that the photonic transformer can still have excellent performance even under these considerations.

First consider the effect of nonradiative processes in connection with a model of a single PV cell. As an example, GaN ($\hbar \omega_g$=3.45 eV) is chosen as the active region material for both the LED and the PV cell since a high-performance GaN-based LED with 95% internal quantum efficiency has been experimentally demonstrated. With the nonradiative recombination included, computations associated with experimentation discussed in the present disclosure show that the GaN PV cell can recover over 97% of the voltage of the GaN LED with a power conversion efficiency over 85% (lower/blue) curved plots in FIG. 1D). The main reason for the imperfect power conversion is the imperfect external quantum efficiency of the LED, which limits the current conversion ratio to about 90%.

In FIG. 1D, the lower (light blue) lines in the respective plots correspond to the case of a 1-μm thick air spacer layer between the LED and the PV cell (e.g., each with a thickness of 1 μm), whereas the upper (orange) lines in the respective plots correspond to the case of the AlGaN spacer layer with a thickness of 1 μm (as is the case for the air spacer layer with a thickness of 1 μm. Also shown in the efficiency plot is the maximum possible efficiency by adjusting the load. In certain experimental examples using the arrangement of FIG. 1D, with a GaN LED layer and PV cell layer being separated via an index-matching AlGaN (spacer) layer (e.g., $Al_{0.5}Ga_{0.5}N$), the distance "d" between the LED and PV cell is much greater than the applicable wavelength λ. While not shown in FIG. 1D, metallic mirrors on the back of the LED and the PV cell may be used for photon recycling and electrical contact purposes.

Next consider the effect of photonic exchange between the LED and the PV cell. For devices according to the present disclosure, it is helpful to achieve highly-efficient or ultra-efficient optical coupling between the active regions of the LED and the PV cell; in certain contexts, such optical coupling is optimized for certain LED emission wavelengths. This is similar to a conventional transformer in which one uses a ferromagnetic core to reduce leakage of the magnetic energy. In the case shown as blue curves in FIG. 1D, the LED and the PV cell are separated by an air spacer layer in the far-field regime with a thickness that is much larger than the emission wavelength (365 nm). In this case, only the propagating-wave channels in air with the in-plane wave vector β<ω/c are utilized for light extraction from the front emitting surface. Enhancement of coupling can be achieved if in addition one can utilize channels with β>ω/c. A standard approach is to operate in the near-field regime where one reduces the thickness of the air spacer layer to be much smaller than the emission wavelength, so that channels with β>ω/c which are evanescent in air, can contribute. Maintaining such small thickness in the air separation layer over a large area however represents a significant experimental challenge. Instead, according to one example of the present disclosure an AlGaN layer is used as the spacer layer between the LED and the PV cell. AlGaN is essentially transparent in the emission wavelength range of GaN and has a refractive index $n_{AlGaN}$ similar to that of GaN. The mole fraction of Al can be adjusted between 0 and 1 according to the fabrication techniques and applications. Here, 0.5 is used to illustrate such theory according to the present disclosure. As has been detailed in the above-referenced Provisional Application document, in doing so, the channels with ω/c<β<$n_{AlGaN}$ω/c are propagating in the AlGaN layer. With a AlGaN spacer layer thickness of 1 μm, the light extraction efficiency of the LED is significantly improved such that the external quantum efficiency of the LED improves to 98.7%, as compared with that of 90.3% for the far-field case with air spacer. The external quantum efficiency of the PV cell is also greatly enhanced for the same physical reason as the enhancement of the quantum efficiency of the LED. The improvement in external quantum efficiency of the LED and the PV cells results in enhanced voltage conversion ratio and conversion efficiency as indicated by the orange curves in FIG. 1D. Importantly, the enhancement here is not a near-field effect. The external quantum efficiency of the LED changes by less than 1% if one reduces the AlGaN spacer thickness from 1 μm to 10 nm. Thus, the thickness of the spacer can be larger than the wavelength without affecting the optical coupling. This is important in practice since the spacer layer also needs to provide electrical insulation between the LED and the PV cell.

Figure 1E:
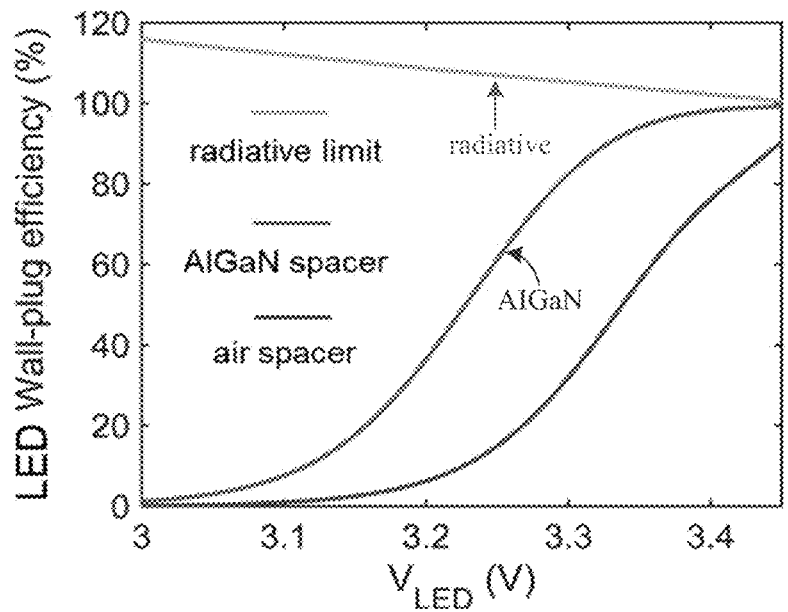

FIG. 1E shows the wall-plug efficiency, i.e., the ratio of the emitted optical power and electrical power consumed by the LED, for three cases: the radiative limit (i.e., nonradiative recombination rates are zero), the AlGaN spacer case, and the air spacer case. The upper (yellow) curve corresponds to the theoretical upper bound in the radiative limit case where the nonradiative recombination rates are zero. As mentioned, the wall-plug efficiency in this ideal case exceeds 100%. The middle (orange) curve and the lower (blue) curves are the AlGaN spacer case and the air spacer case. The wall-plug efficiency is greatly enhanced in the AlGaN spacer case, approaching the radiative limit, as compared with the far-field air spacer case. For example, the peak value of the wall-plug efficiency is enhanced from 90.6% to 99.3%, resulting in an excellent overall conversation efficiency near 97%.

Turning now to the penalties from the series resistance, it may be seen that the case with the AlGaN spacer layer as considered above yields superior performance. In the presence of series resistances of the LED and the PV, denoted as $R_{s,LED}$ and $R_{s,PV}$ respectively, the input and output voltage can be related based on the circuit diagram in FIG. 1C as:

$$V_{IN} = V_{LED} + I_{LED} \frac{R_{s,LED}}{A_{LED}}, \qquad (6)$$

and $$V_{OUT} = N\left(V_{PV} + I_{PV} \frac{R_{s,PV}}{A_{PV}}\right). \qquad (7)$$

For GaN LEDs, a series resistance as small as 1 mΩ·cm² has been demonstrated experimentally, and GaN tunnel junctions with series resistance as low as 0.01 mΩ·cm² have been demonstrated as well.

Figure 1F:
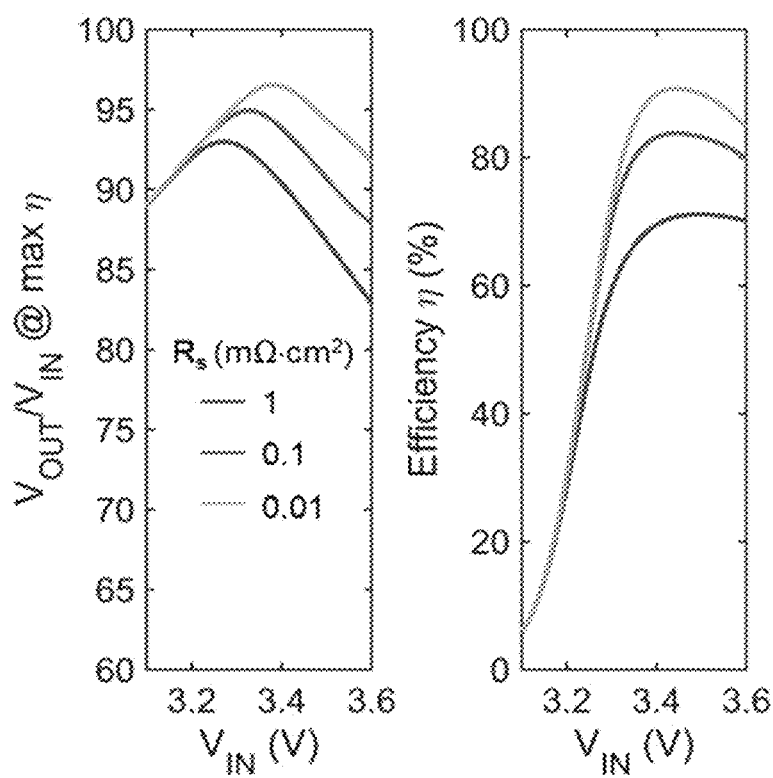

FIG. 1F shows the modeled GaN photonic transformer performance in the near field for series resistances ($R_sR_s$, $_{PV}$=$R_{s,LED}$) of 1, 0.1, and 0.01 mΩ·cm² (assume the number of PV cells N=100). In general, the performance degrades as the series resistance goes up. For high input voltages above 3.2 V, the series resistance penalty becomes the dominant limitation on the voltage conversion ratio and further increasing the input voltage leads to diminished performance. However, the voltage ratio at the maximum efficiency point can still reach over 90 (for N=100) for all three cases, and peak efficiency can exceed 90% when $R_s$=0.01 mΩ·cm², indicating that the excellent performance persists even in the presence of realistic series resistance. Note that, in theory, conventional switching converters can also have arbitrary voltage conversion ratio by controlling the duty cycle. However, parasitic losses in the circuit[1] typically place a severe limit on the useful range of conversion ratios to the order of ten. In contrast, the conversion ratio of our photonic transformer is not subject to such a limit. The high conversion ratio and efficiency indicate the great potential for photonic transformers to outperform conventional switching converters.

Figure 1G:
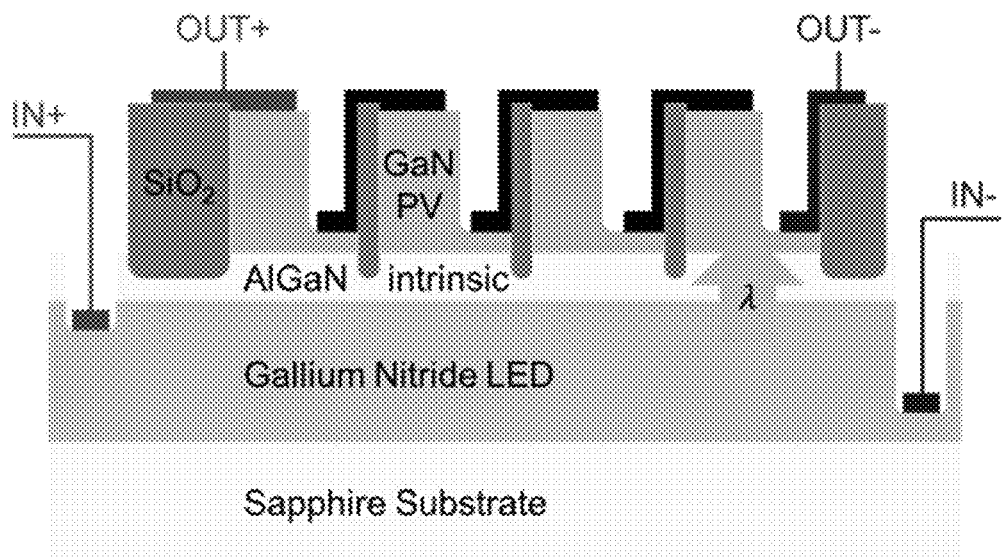

FIG. 1G illustrates a monolithic solid-state device design according to another example aspect of the present disclosure. Separating the GaN LED layer and PV cell layer is the index-matching AlGaN layer (e.g., $Al_{0.5}Ga_{0.5}N$, and where the distance "d" between the LED and PV cell is much greater than the applicable wavelength λ) that provides both the optical coupling (e.g., for the emission wavelength of the LED) and electrical insulation. Since both LEDs and PV cells can be readily miniaturized and monolithically integrated on a single die, the photonic transformer can be made with a far smaller footprint than those of previous switch-mode DC converters, which require a large, often off-chip, amount of space. As partially shown via thick black lines, on the back of the LED and the PV cell are metallic mirrors for photon recycling and electrical contact purposes.

Figure 2A:
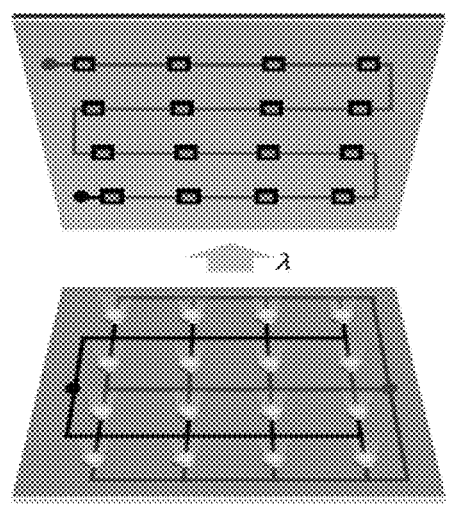
FIGS. 2A and 2B show another example of a photonic transformer configuration with a board design schematic in FIG. 2A, photos of two printed-circuit boards in FIG. 2B, and related operational/performance graphs in FIG. 2C.
Figure 2B:
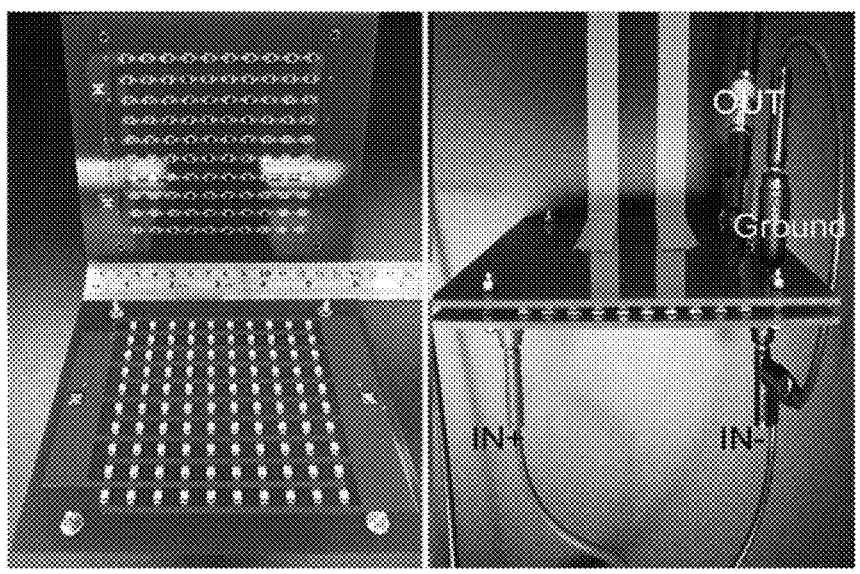
Figure 2C:
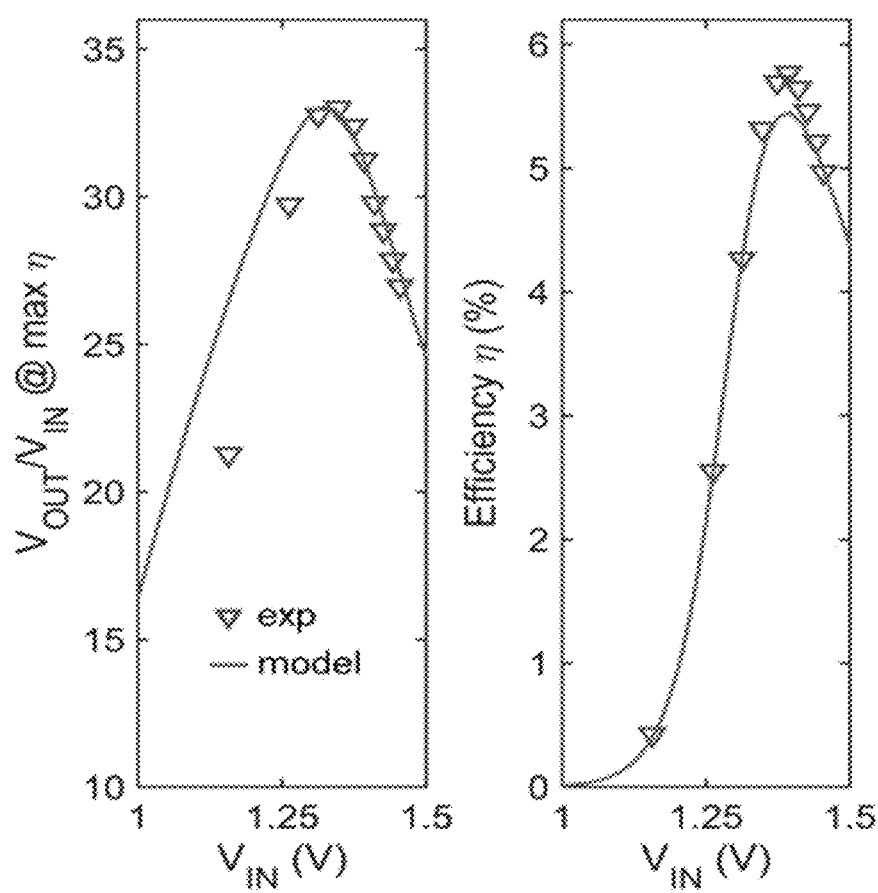

FIGS. 2A through 2C are useful to depict attributes of another example of a photonic transformer configuration consistent with a board design schematic as in FIG. 2A. More specifically, these figures shows proof-of-concept verification of the power conversion functionality of the DC-to-DC photonic transformer, with: FIG. 2A being a schematic of a board design with the same number of LEDs (bottom half) and PV cells (top half); FIG. 2B being photos of the two printed circuit boards consisting of LEDs and PV cells (left) and the assembled photonic transformer (right); and FIG. 2C being measured (blue/triangles) voltage ratio and conversion efficiency in respective plots. The (red) curved lines are predictions from the model.

To make a preliminary proof-of-concept realization of the photonic transformer a circuit prototype is constructed according to the present disclosure using commercially available off-the-shelf LEDs and PV cells. Instead of using one LED with a large emitting area, here used are multiple LEDs connected in parallel, as shown in the printed circuit board (PCB) design in FIG. 2A. The same number (N) of the LEDs and the PV cells are used. In the ideal case, a photonic transformer using one LED or multiple LEDs connected in parallel have identical theoretical performance, provided that the total emitting area of the LED is the same. Using multiple LEDs rather than one allows the experimentation to achieve a better optical coupling between the LED and the PV cell, and better control over the voltage conversion ratio.

In this example, N=100 is chosen to show the high conversion ratio that the photonic approach enables. GaAs LEDs (Osram SFH4253-Z) and Si PV cells (Osram BPW 34 S-Z) may be used to ensure reasonable spectral overlap between the LED and the PV cell. Note that these choices are only for demonstration purposes and are far from the optimized devices discussed above.

FIG. 2B shows the LED and PV cell circuits (on a custom-designed circuit board) and the assembled prototype consisting of the LED board mounted to a corresponding PV cell board. To characterize the photonic transformer prototype, the LED board is connected to a DC power supply (Keysight E36312A) and the current-voltage (I-V) curve of the PV cell board may be measured using a source meter (Keithley 2636B) at different input voltage levels. The maximum efficiency of the transformer may be obtained at a given input voltage level by locating the maximum power point of the PV cell array on the measured I-V curve.

FIG. 2C shows the voltage ratio at the maximum efficiency point and the corresponding efficiency of the transformer for different input voltages. The efficiency peaks at the input voltage of $V_{IN}$=1.39 V. Further increasing the input voltage leads to a decrease in efficiency due to the series resistance of the LEDs and the PV cells, as discussed earlier in the theoretical calculation shown in FIG. 1F. At the operation point for peak efficiency (5.77%), a voltage conversion ratio 31.2 is obtained, a clear demonstration of the DC voltage conversion functionality of an exemplary photonic transformer according to the present disclosure. Note that the ratio between the open-circuit voltage and the input voltage is 40.9. Therefore, one could tune the operation point to obtain an even higher voltage conversion ratio. Based on the same theoretical model that has been used to analyze the GaN transformer above, the proof-of-concept photonic transformer circuit may be analyzed, and the predicted maximum efficiency of the transformer is obtained along with the corresponding voltage ratios at given input power levels. The predictions are shown in FIG. 2C as continuous curves, which agree well with the experimentally measured values. This agreement provides validation of our theoretical model.

The use of steady continuous-wave (CW) photon transport in the photonic transformer enables its low-noise operation when compared with the switching action in the switch-mode converter. As mentioned, the switching action in conventional switch-mode converters produces undesirable effects as switching currents not only generate noise in the circuit in the form of ripples in the output voltage level but also emit outgoing radiation contributing to EMI, which can corrupt the operation of sensitive circuits nearby or interfere with signal transmission. To illustrate this point, one may measure and compare the electromagnetic noise generated by the conventional switch-mode converter and the photonic transformer using a setup with an oscilloscope to monitor the output voltage fluctuations and a field probe connected to a spectrum analyzer to monitor the emitted electromagnetic fields.

For the switch-mode converter, in this particular experimental example two commercial DC voltage up-converters (not illustrated but implemented via MCP1640EV from Microchip and LT3482EUD from Analog Devices are sampled, hereafter referred to as converters 1 and 2, respectively). Both circuits use a boost configuration with converter 2 featuring a voltage doubler stage at the output to further increase the conversion ratio (27 compared to 3.3 for converter 1). For converter 1, the output contains voltage ripples (e.g., from −4 mV to +3 mV over 2 microsecond periods) at its switching frequency of 500 kHz from the underlying charging and discharging cycles. Further, the circuit produces outgoing radiation at the switching frequency and its harmonics which shows up prominently as sharp peaks (from 10-18 dBm) in the radiation spectrum. For converter 2 which uses a higher switching frequency (1.1 MHz) the output voltage ripples are significant but greatly reduced due to the increased effectiveness of the output capacitor filter at higher frequency and higher load impedance. However, even though converter 2 is designed to output voltage with extremely low noise (based on the datasheet of the product) as observed, its radiation spectrum still features a prominent set of peaks (again roughly from 10-18 dBm) at the switching frequency and its harmonics. In contrast, our photonic transformer exhibits intrinsically low noise operation (smaller than the background level), both in terms of the output voltage fluctuations and radiative electromagnetic noise.

Figure 3C:
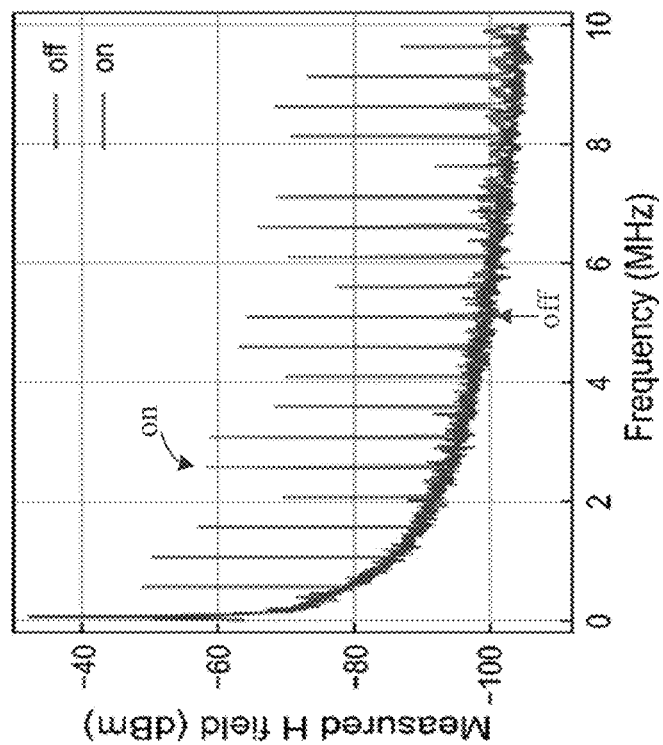
FIG. 3A shows an exemplary photonic transformer, with FIGS. 3B and 3C showing operational graphs respectively including an output-voltage graph and an emission-output graph for the photonic transformer of FIG. 3A.
Figure 3A:
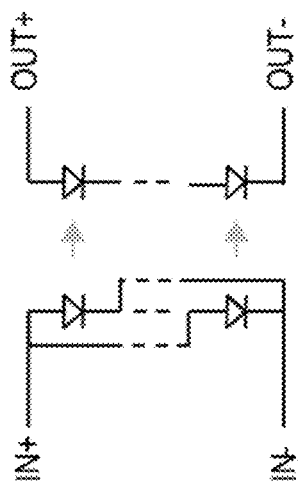
Figure 3B:
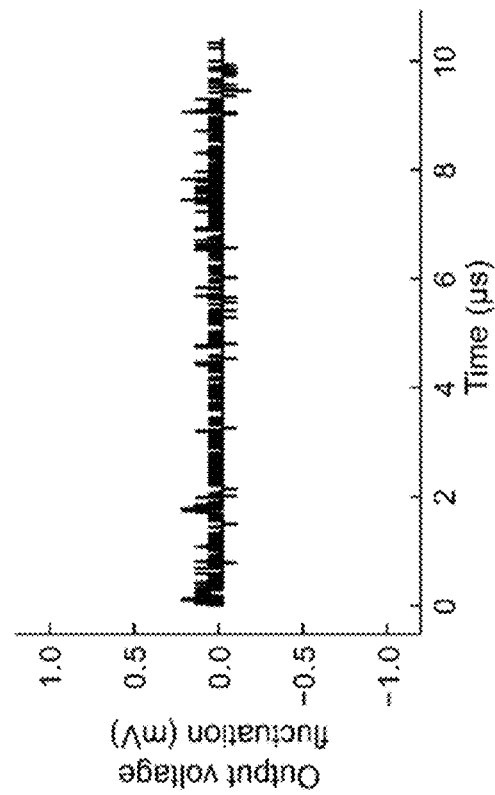

As another example according to the present disclosure, the photonic circuit of FIG. 3A is free of any internal switching mechanism. As a result, the output voltage waveform as shown in FIG. 3B exhibits no noticeable ripples even without using an output capacitor, and the field measurements as plotted in FIG. 3C show no detectable emission above the background level. More particularly, FIGS. 3A-3C shows aspects relating to experimental measurements of the output noise of certain example photonic transformers according to the present disclosure as follows: FIG. 3A shows a schematic of the photonic transformer under test; FIG. 3B shows the output voltage waveform for the photonic transformer of FIG. 3A; and FIG. 3C shows power spectra of the electromagnetic field emitted from this photonic transformer circuit when the photonic transformer is power is switched on and off. Here, the contributions to voltage noise power at load are as follows: 21 nV$^2$/Hz from shot noise in PV cells and 55 nV$^2$/Hz from the series resistance of the multiple PV cells used in the photonic transformer; these are small compared with the room temperature thermal noise power of load resistance ($R_L$) in isolation, $4kTR_L$=1100 nV$^2$/Hz. Note that under our test conditions, the efficiencies of similarly tested commercial switch-mode electronic converters (e.g., first device being Microchip MCP1640EV and second device being Analog Devices LT3482EUD) are respectively 78% and 46%, which are higher compared to the proof-of-concept photonic transformer prototype as demonstrated (in the above-referenced Provisional Application, an analysis is conducted of the non-idealities in the photonic transformer prototype and this shows that the efficiency of even the far from ideal far-field GaAs—Si photonic transformer with an air spacer can be improved to over 40% using experimentally demonstrated or routinely achieved values for the limiting parasitic loss factors.

Further, note that the photonic transformer can also operate as a step-down DC transformer if the LEDs are in series and PV cells are in parallel. The photonic transformer is highly scalable and can be easily integrated on chip[34]. The conversion ratio or the output voltage can be modified by controlling how many PV cells are connected in the circuit as well as the circuit topology. Other high-quality semiconductors[10], such as GaAs, AlGaAs, InGaAs, and InP, may be used depending on the application and input voltage range. Such example photonic transformers according to the present disclosure can be packaged in biocompatible packing to make noise-free implantable voltage transformers. In a more particular example, such an exemplary photonic transformer also inherently provide electrical isolation between the input and output, protecting the load from destructive or hazardous electric shocks. Meanwhile, the voltage conversion process is also immune to external electromagnetic noise. While the initial application of the photonic transformer concept is likely in electronic circuits, one may envision that this concept can be scaled up to a power level relevant for electric power network. In such an example of the present disclosure, the photonic transformer highlights the significant potential for using photons as the intermediate energy carrier in power conversion applications.

Figure 4:
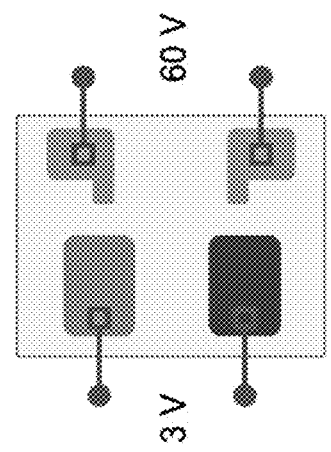
FIG. 4 is a diagram of another example embodiment according to the present disclosure.
Figure 4:
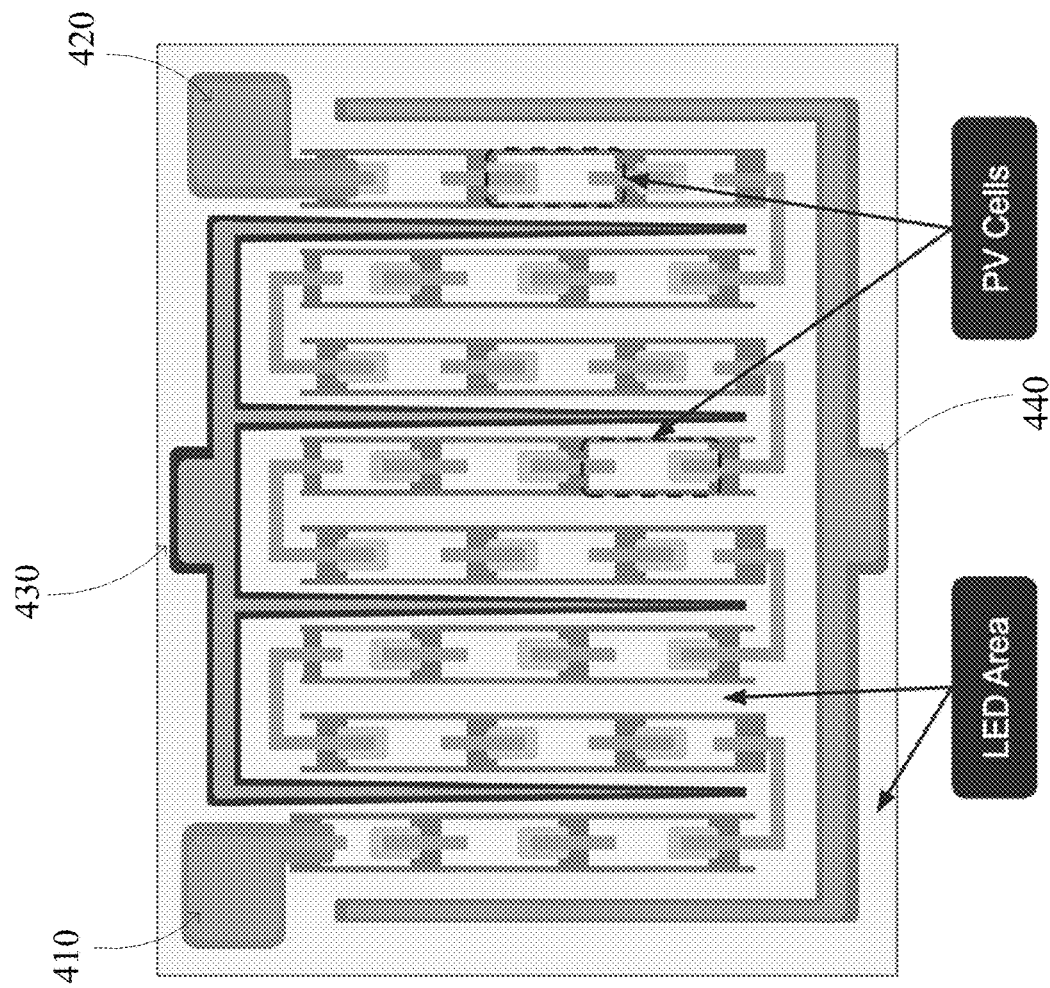

FIG. 4 shows an overhead schematic (block-like) diagram of another example embodiment according to the present disclosure. The lateral geometry shown provides certain benefits for fabrication complexity and device performance. Several PV cells are fabricated in a laterally arranged pattern and then connected in series. Patterned metal films that double as contacts (e.g., 410, 420, 430 and 440) and series-connecting traces are used, avoiding the need for a large number of wire bonding steps. The serpentine pattern allows a large number of cells to fit in a small area while minimizing the additional series resistance from the series-connecting metal traces. The serpentine pattern also leaves area for the LED layer to be contacted. Long fingers interdigitated with the PV cell pattern minimize the series resistance of the LED. A key to the right side of FIG. 4 shows the output contacts 410 and 420 (e.g., 60 V from the PV device including the several PV cells in this example) and the input contacts 430 and 440 (e.g., from a 3 V supply source).

Figure 5:
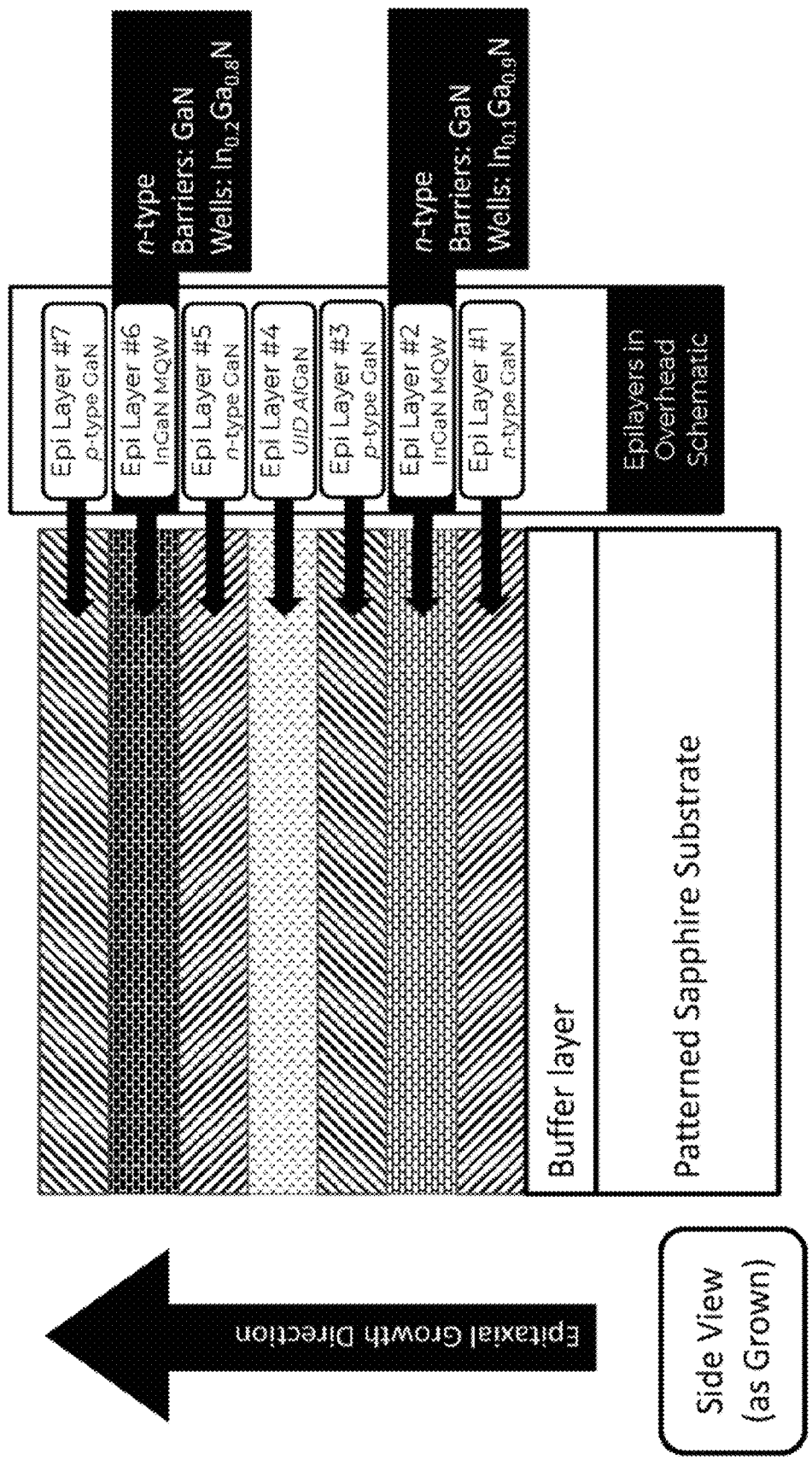
FIGS. 5 and 6 show a detailed schematic of one such example relating to the above-noted examples according to the present disclosure.
Figure 6:
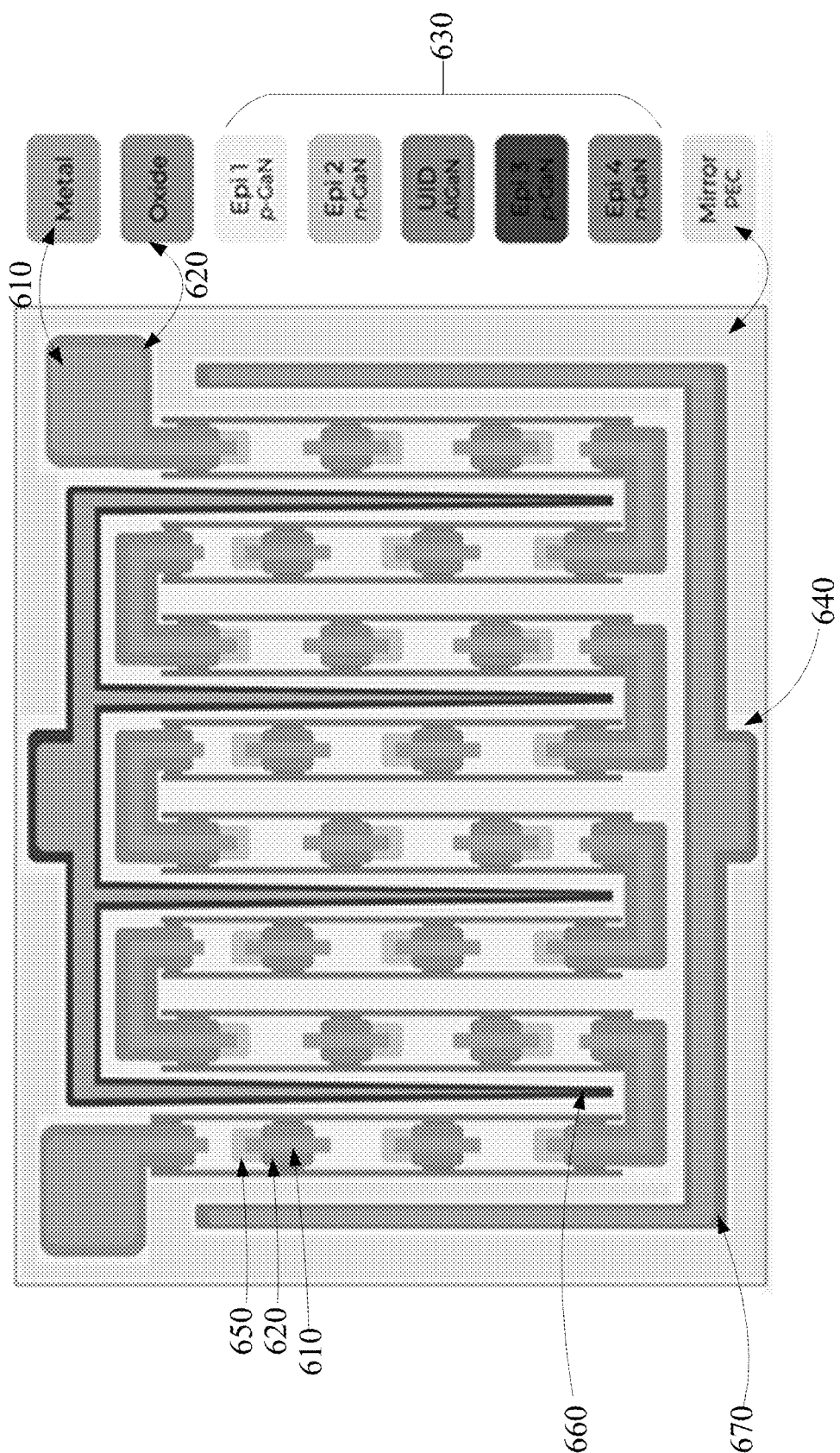

A more detailed schematic of one such example according to the present disclosure is shown in FIGS. 5 and 6. FIG. 5 shows the bare epitaxial layer stack before fabrication, with important layers named to the right. FIG. 6 is an overhead schematic including conductor layers 610, post-epitaxial insulator 620, and the epitaxial layers depicted collectively as 630. Individually, the epitaxial layers are depicted in FIG. 6 as epi 1 (p-GaN) 640, epi 2 (n-GaN) 650, epi 3 (p-GaN) 660, and epi 4 (n-GaN) 670. In this example, in order to use a patterned metal film to form the serial connections between adjacent PV cells, a patterned post-epitaxial insulator layer is deposited. Without such a layer, the metal trace may make contact with the sidewall of the light absorbing layer of the PV cell which may lead to an electrical short circuit and lack of proper operation. In FIG. 6, the post-epitaxial insulator layer is labeled "Oxide."

Figure 7:
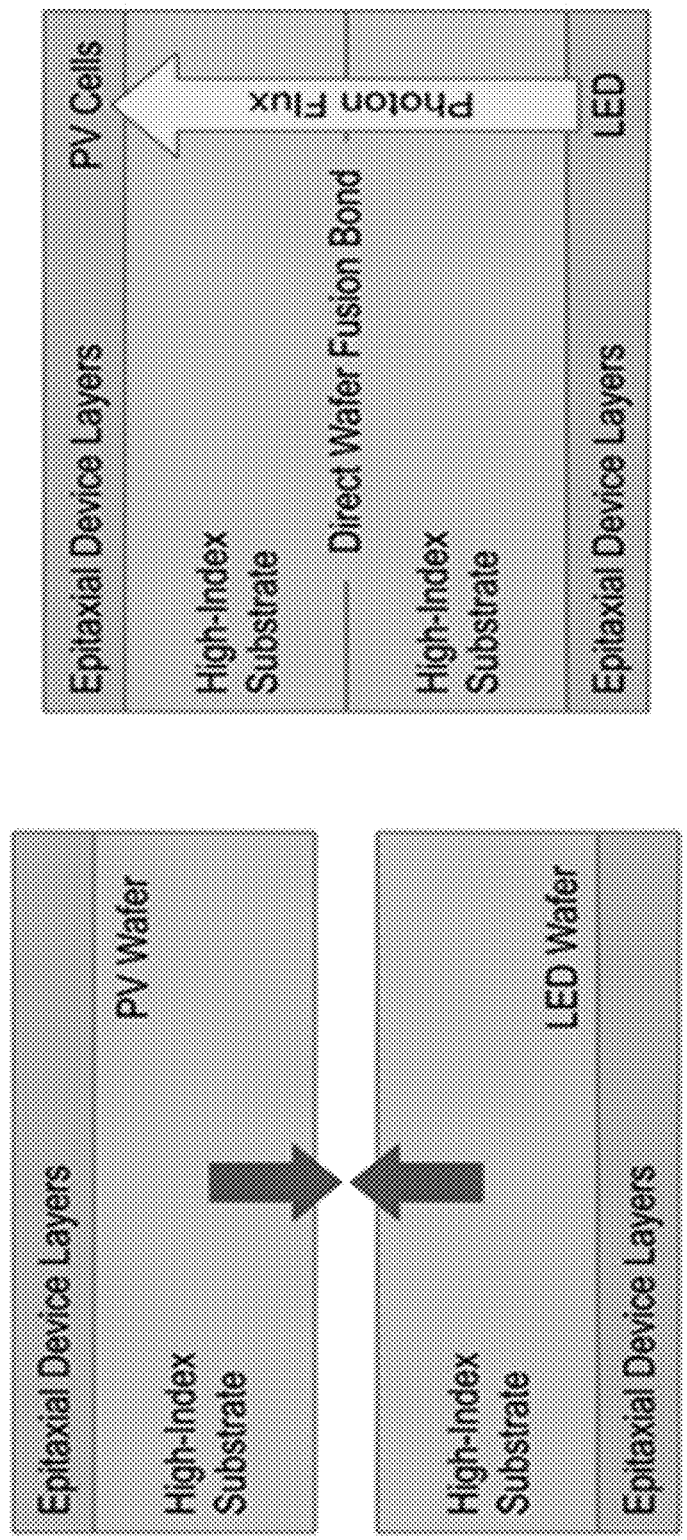
FIG. 7 shows an example wafer bonded design, according to the present disclosure.

An example wafer bonded design depicted in FIG. 7 is shown. This design is directed to provide an increase in the maximum output voltage and decrease the complexity of the growth and fabrication processes. The design works when the bandgap of the LED and PV devices are below that of the substrate, rendering the substrate transparent to the relevant wavelengths. For this design, fabrication includes three parts: bonding, LED fabrication, and PV fabrication. For bonding, a direct wafer fusion bond is formed between the non-epi sides of two substrate wafers. These substrates can be joined with excellent optical coupling (i.e., highly transparent to photons incident at all angles), allowing light to be emitted from one wafer's device layers, propagate through the combined substrates, and be absorbed by the other wafer's device layers. After bonding, one surface of the combined wafer can be fabricated into the LED(s) and the other surface can be fabricated into the PV cell array, followed by dicing and packaging.

The fabrication complexity of this design is much lower, because patterned etches and metal lift-off steps for the LED contacts and those for the PV contacts no longer affect one another. Notably, this design does require a backside-aligned process, somewhat increasing the fabrication complexity. The growth process is simplified because only one active layer is grown on a given substrate; moreover, the index-matched spacer layer does not need to be grown epitaxially as its function is served by the substrates. The design increases the theoretical maximum output voltage of the transformer because the high output voltage is stood off by a much thicker layer. In the normal design, the bodies with the highest voltage difference during operation are separated by an epitaxial layer, typically on the order of 1 μm thick. In the wafer-bonded design, the bodies are separated by the combined substrates, typically on the order of 1 mm thick.

This approach may be particularly important for GaN-based designs because as-grown p-type layers have their Magnesium acceptor sites activated by a high temperature process in which undesirable passivating hydrogen are released. The diffusion of this hydrogen out to the solid surface is impeded when the layer to be activated is buried, substantially complicating the epitaxial growth process for a photonic transformer. The wafer bonded design may also benefit GaN-based implementations because bare epitaxy with a single active device layer is commercially available for these materials.

A similar outcome can be achieved by an approach which involves transferring device films from their original growth wafers onto two sides of an appropriately high-index, transparent wafer. This approach may be suitable for Gallium Arsenide-based device layers transferred from their opaque substrates onto two sides of a single Gallium Phosphide or Silicon Carbide wafer.

In addition to its high performance in terms of conversion ratio and efficiency, the use of a steady photon flux enables the photonic transformer to produce a ripple-free output voltage. Here, therefore, the contributions from the photonic transformer to the output voltage fluctuations are primarily the photon shot noise and the thermal noise from the series resistance, both of which are fundamental in nature. These noises have broad frequency spectra. But, even when integrated over the entire frequency bandwidth, the power in such noises are still small in comparison with typical thermal noise power associated with the load resistance. This contrasts with the switch-mode converters where the output voltage ripple as well as the accompanying EMI are an unavoidable result of switching.

Certain methods are used in the above and related experimental and/or more-detailed and proof-of-concept examples. In connection with certain of these examples, in the theoretical description of the GaN photonic transformer, the fluctuation-dissipation theorem may be used to model the radiative recombination rate since this approach is applicable for both the near- and far-field scenarios, and one can describe the photon transport process without explicitly defining the radiative recombination coefficient, escape probability, and light extraction efficiency. Here consider the case where the surfaces of the LED and the N PV cells are parallel, and the schematic shows a unit cell of the whole structure. The above-bandgap emission from a diode is due to a fluctuational current source j that satisfies the following equation 8 (or M1 from the above-referenced U.S. Provisional Application):

$$\langle j_k(x', \omega) j_n^*(x'', \omega') \rangle = \frac{4}{\pi} \omega \varepsilon_0 Im(\varepsilon_e) \Theta(\omega, T, V) \delta_{kn} \delta(x' - x'') \delta(\omega - \omega') \tag{8}$$

where k and n denote the directions of polarization, x' and x'' are position vectors, $Im(\varepsilon_e)$ is the imaginary part of the dielectric function, $\varepsilon_0$ is the vacuum permittivity, $\delta$ is the Dirac delta function, and $\Theta$ is the photon energy in a mode at:

$$\Theta(\omega, T, V) = \frac{\hbar \omega}{\exp\left(\frac{\hbar \omega - qV}{kT}\right) - 1} \tag{9}$$

where V is the bias on the active region and qV acts as the chemical potential of photons. Using the formalism of fluctuational electrodynamics, the energy transfer between the LED and the PV cell can be modeled as $$Q = Q_{LED \to PV}(V_{LED}) - Q_{PV \to LED}(V_{PV}) \tag{10}$$

where $$Q_{LED \to PV}(V_{LED}) = \frac{A_{LED} f_{LED \to PV}}{8\pi^3} \int_{\omega_g}^{\infty} d\omega \int\int \xi(\omega, k_x, k_y) \Theta(\omega, V_{LED}) dk_x dk_y \tag{11}$$

and $$Q_{PV \to LED}(V_{PV}) = \frac{A_{PV} f_{PV \to LED}}{8\pi^3} \int_{\omega_g}^{\infty} d\omega \int\int \xi(\omega, k_x, k_y) \Theta(\omega, V_{PV}) dk_x dk_y \tag{12}$$

In the above two equations, $\xi(\omega, k_x, k_y)$ is the energy transmission coefficient summing over two polarizations and has a maximum value of 2. The non-ideality from less than 100% efficiency of light extraction from the LED and absorption from the PV cell are reflected in the energy transmission coefficient being less than 2. A is the emitting surface area. For the case considered here are $A_{LED} = N A_{PV}$, $f_{LED \to PV} = 1/N$, and $f_{PV \to LED} = 1$. The photon flux can be obtained accordingly as $$F_{LED \to PV}(V_{LED}) = \frac{A_{LED} f_{LED \to PV}}{8\pi^3} \int_{\omega_g}^{\infty} d\omega \int\int \xi(\omega, k_x, k_y) \frac{\Theta(\omega, V_{LED})}{\hbar \omega} dk_x dk_y \tag{13}$$

and $$F_{PV \to LED}(V_{PV}) = \frac{A_{PV} f_{PV \to LED}}{8\pi^3} \int_{\omega_g}^{\infty} d\omega \int\int \xi(\omega, k_x, k_y) \frac{\Theta(\omega) V_{PV}}{\hbar \omega} dk_x dk_y \tag{14}$$

The nonradiative recombination rates of the LED and PV cell are $$R_a = A_a(C_{n,a} n_a + C_{p,a} p_a)(n_a p_a - n_{i,a}^2) t_a + \frac{1}{\tau_a} \frac{n_a p_a - n_{i,a}^2}{n_a + p_a + 2n_{i,a}} A_a t_a \tag{15}$$

In the above equation, a=PV cell or LED. The first and the second terms on the right-hand side are the Auger and Shockley-Read-Hall (SRH) recombination rates, respectively. $\tau$ is the bulk SRH lifetime, and $C_p$ and $C_n$ are the Auger recombination coefficients for holes and electrons, respectively. Using equations. (13), (14), and (15), together with equations (3) and (4), a model of the I-V curve for both the LED and PV cell is obtained.

According to other example embodiments consistent with aspects of the present disclosure, a photonic transformer may include multiple LEDs and/or multiple PV cells. In certain of these example embodiments, an analysis may be performed on the ideal performance of the setup with identical N LEDs and N PVs (N being an positive integer). For certain circuitry (such as in FIG. 2A), the LEDs have the same current and the PV cells have the same voltage. Denoted are the voltage (current) of each LED and PV cell as $V_{LED}$ ($I_{LED}$) and $V_{PV}$ ($I_{PV}$), respectively. Due to the symmetry of the system, the input and output voltages are respectively $V_{IN}=V_{LED}$ and $V_{OUT}=NV_{PV}$, when series resistance is neglected. The input and output currents are respectively $I_{IN}=NI_{LED}$ and $I_{OUT}=-I_{PV}$. Compared to the one LED and N PV cells case discussed herein, the only difference is in the formula for $I_{IN}$. In the ideal case, the total current in N LEDs in parallel is equal to the current in one LED, provided that the total emitting area of the N LEDs is the same with the emitting area of the one LED. Therefore, $I_{IN}$ is equivalent for the N LEDs case and one LED case. Thus, the photonic transformer will have the same theoretical performance for the two cases. Practically, using multiple LEDs may assist the optical coupling between the LEDs and PV cells, and help eliminate the series resistance caused by current spreading in large active area LEDs.

As one example for how such an experimental photonic transformer prototype may be constructed according to the present disclosure, consider as a starting point two circuit boards designed and fabricated with one to populate 100 LEDs (Osram SFH4253-Z GaAs LEDs) and the other to house 100 PV cells (Osram BPW 34S-Z Si PIN photodiodes). The LEDs/PV cells are arranged in a 10×10 grid with 1 cm pitch in either direction on the corresponding board and routed to realize a parallel (series) connection on the LED (PV) board. Power connections for both boards are made on the reverse side of the boards. The two boards are mounted with LEDs and PV cells facing each other using alignments holes placed at each board corner through which a series of bolts, spacing washers, and nuts are used to maintain LED-to-PV alignment and ensure good optical coupling.

For characterizing performance of a single PV cell, view factor and LED EQE may be measured. A PV cell in general has a less than 100% probability of converting an incident photon into photocurrent. The external quantum efficiency of one such PV cell may be denoted as $\eta_{RES}$ to account for the nonideal response of the PV cell. Test data shows the external quantum efficiency of the Si PV cell and the electroluminescent emission spectrum of the GaAs LED. The external quantum efficiency of the PV cell is defined as the ratio between the output electron number flux and the input photon number flux at the short-circuit condition. The spectrum-averaged external quantum efficiency of the PV cell from 725 nm to 925 nm is $\eta_{RES}=0.897$. The average photon energy of the LED emission spectrum is 1.46 eV (847 nm). Based on the datasheet, the emitted optical power from the LED is 40 mW at $I_{IN}=70$ mA. With the averaged emitted photon energy, the external quantum efficiency of the LED is computed at this input power level and find EQE=39.1%.

To measure the photon transfer efficiency from the LED to the PV cell, another device according to the present disclosure has only one LED and one PV cell. The ratio of the input current of a LED and the short-circuit current of the PV cell are then measured and from which:

$$\frac{I_{OUT}}{I_{IN}} = EQE \times f_{LED \to PV} \times \eta_{RES} \tag{16}$$

At $I_{in}=70$ mA, a current ratio of 0.254 is measured. Together with the averaged external quantum efficiency of the PV cell, $f_{LED \to PV}=0.73$ is obtained. In the device model, assume this view factor is the same for every LED and PV cell pair in the transformer prototype. Then measured are the I-V curves of the LED array. For each input level, one may measure the I-V curve of the PV cell array. Based on equation (16), the EQE of the LED array are obtained at different input levels from the ratio of output short circuit current and the input current.

Discussion is now directed to a device model for an example photonic transformer prototype according to the present disclosure. Since the prototype in this instance is a far-field device, the model may be simplified to highlight the important non-idealities. Instead of equation (5), the photon flux produced by the LED is computed as:

$$F_0 = A_{LED} B_{LED} n_{LED} p_{LED} t_{LED} \tag{17}$$

In the above equation, t is the thickness of the active region of the diode, A is the area of the active region, n and p are the electron and hole concentrations, respectively, and B is the radiative recombination coefficient. Due to the refractive index contrast between the LED and air, many of the generated photons will be trapped in the LED and eventually absorbed parasitically by the LED such as in the contacts. Therefore, a light extraction efficiency ($\eta_{EXT}$) may be used, and this describes the proportion of photons that can escape from the LED into free space. The imperfect transmission of light from the LED to the active region of the PV cell is captured by the geometric view factor $f_{LED \to PV}$. One may lump or group the internal photon loss in the LED and the PV cell detection photon loss all in the ambient terms in equations (3) and (4). With these parameters, the photon flux terms in equations (3) and (4) can be modeled as:

$$F_{LED \to PV} = f_{LED \to PV} \eta_{EXT} \eta_{RES} F_0 \tag{18}$$

and $$F_{LED \to amb} = (1 - f_{LED \to PV}) \eta_{EXT} F_0 + (1 - \eta_{EXT}) F_0 f_{LED \to PV} \eta_{EXT} (1 - \eta_{RES}) F_0 \tag{19}$$

In equation (19), the first term on the right-hand side is the photon loss directly to the ambient, the second term is the internal photon loss in the LED, and the third term is the photon loss in the incident photon flux that is received but not absorbed by the active region of the PV. Since the photon fluxes emitted by the Si PV cell and the ambient in general are much smaller compared to that from the emission from the GaAs LED with a bias, one may neglect the other photon flux terms in equations (3) and (4). The nonradiative terms are the same as equation (15). Substituting equations (18), (19) and (15) into equations (3) and (4), one may obtain a model for the I-V curves of the LED and PV cell boards. Besides the parameters that are measured (i.e., view factors and LED EQE), one may obtain the remaining parameters used in the model by fitting the measured I-V curve of the LED and the set of I-V curves of the PV cell iteratively using the fmincon function provided by MATLAB.

From the device model for the prototype, several aspects may altered or improved for better performance. These aspects include the series resistance of the PV, the external quantum efficiency for both the LED and the PV, and the optical coupling between the LED and the PV cell. The series resistance in the subject device according to the present disclosure ($R_{s,PV}$=2.33 Ω·cm$^2$) can be improved significantly to as small as 0.32 Ω·cm$^2$ by optimizing the PV cell design (e.g., see Table 2 below). This improvement especially helps to minimize the loss at high power levels. Also, one can use higher quality semiconductor materials to improve the radiative efficiency of the LED and the PV. For the LED, both the Auger process and the SRH process are important nonradiative non-idealities since the LED is operating near its peak of quantum efficiency. For the PV cell, the SRH process is the major nonradiative recombination process because its bias at relevant operating conditions is far below its bandgap. With the relevant parameters replaced by the improved numbers reported in the literature, efficiency and the voltage conversion ratio can be both significantly improved for all input power levels. In addition, the optical coupling between the LED and the PV cell can be improved. This includes the light extraction improvement for the LED, which reduces the internal photon loss inside the devices, and increasing the view factor between the LED and PV cell to suppress photon leakage to the environment. Note that the curve showing 'material' improvements also includes the previously mentioned improvement of the series resistance of the PV cell; the 'optical' curve includes both 'material' and series resistance improvements. With all these improvements implemented, the performance can be raised.

Such an example experimental photonic transformer circuit may also be analyzed for noise. Noise processes in a photonic transformer may be described as consisting of or including only one LED and one PV cell. The photon statistics of an LED connected to a voltage source is well characterized by photon shot noise. The noise in the PV cell at low injection levels can be considered as a result of independent noise fluctuations, each modeled as shot noise, where $I_{photo}$ is the photocurrent, $$I = I_0 e^{\frac{qV}{\eta kT}}$$

is the junction's forward current, and $I_0$ is the saturation current[42,44]. Hence the combined noise is $S_{I_{PV}}(f)=2q(I_{photo}+I+I_0) \leq 4qI_{photo}$ where the upper bound is reached at the open-circuited operation $$(I_{OUT} = 0). \quad R_j = \frac{\eta kT/q}{I}$$

and $C_j$ are small-signal junction resistance and capacitance with $R_j C_j \approx$ minority carrier lifetime, $\tau$[45,46]. In addition, the series resistance $R_s$ contributes Johnson noise with $S_{I_{Rs}}$=4 kT/$R_s$. For a photonic transformer with N PV cells, fluctuations from all the PV cells combine to produce noise at the load $S_V(f)=S_{V,PV}(f)+S_{V,Rs}(f)$ where $S_{V,PV}(f)=NS_{I_{PV}}(f)|H_{PV}(f)|^2$ and $S_{V,Rs}=NS_{I_{Rs}}(f)|H_{Rs}(f)|^2$ are the contributions from $S_{I_{PV}}$ and $S_{I_{Rs}}$, respectively, with $$H_{PV}(f) = \left(\frac{Z_j}{NZ_j + NR_s + R_L}\right) R_L \text{ and } H_{Rs}(f) = \left(\frac{R_s}{NZ_j + NR_s + R_L}\right) R_L$$

being the transfer functions from their respective individual noise sources to voltage noise on the load, and $$Z_j = R_j \| \left(\frac{1}{2\pi i f C_j s}\right).$$

One may evaluate these noise contributions for the photonic transformer circuit under the measurement conditions of FIG. 3 with relevant circuit parameters as follow: N=100, $I_{photo}$=9 mA, $R_j$=6Ω, $\tau$=92.8 ns, $R_s$=33Ω, and $R_L$=68 kΩ. Since $R_L \gg NR_s$, $S_{V,PV}(f)$ reduces to a flat noise power of $4qI_{photo}NR_j^2$=21 nV$^2$/Hz up to the cut-off frequency of $$f_c = \frac{1}{2\pi\tau} = 1.7 \text{ MHz}$$

and $S_{V,Rs}$ reduces to 4 kTNR$_s$=55 nV$^2$/Hz (up to the bandwidth of the oscilloscope).

These above-noted noise contributions from the photonic transformer represent minor contribution when compared with a standalone resistive load of $R_L$ which produces noise power 4 kTR$_L$=1100 nV$^2$/Hz at room temperature—this statement applies in general for near-constant output voltage operation which implies $R_L \gg NR_s$. Also, note that low-frequency noise (often referred to as "1/f" or flicker noise), which typically shows up in electronics and manifests as fluctuations over long time scale, may contribute to higher noise at low frequency. Such noise has been found to correlate with defects in semiconductor lattice and contacts, and can be reduced with higher quality device preparation.

For measurements, characterization of the experimental data addressed above and further certain further more-detailed example implementations of a photonic transformer, the following parameters (in Table 1) associated with the photon emitter (e.g., LED or LEDs) and the photovoltaic device including one or more PV cells cell(s) may be used.

TABLE 1

| | LED | PV |
|---|---|---|
| active region material | GaAs | Si |
| bandgap | 1.424 eV | 1.12 eV |
| SRH lifetime (τ) | 22 ns | 92.8 ns |
| radiative recombination coefficient (B) | 1.3 × 10$^{-10}$ cm$^3$/s | 1 10$^{-14}$ cm$^3$/s |

TABLE 1-continued

| | LED | PV |
|---|---|---|
| Auger coefficient (C) | $9.1 \times 10^{-30}$ cm$^6$/s | $1.3 \times 10^{-30}$ cm$^6$/s |
| active region area (A) | 0.2 mm 0.2 mm | 2.65 mm 2.65 mm |
| active region thickness (t) | 39.3 nm | 1.09 µm |
| series resistance (Rs) | 1.47 mΩ cm$^2$ | 2.34 Ω cm$^2$ |
| LED light extraction efficiency (ηEXT)/PV EQE (ηRES) | .041 | .0897 |
| doping level | intrinsic | $N_d = 1.8 \times 10^{15}$ cm$^{-3}$ |
| view factor $f_{LED \to PV}$ | 0.73 | |

In Table 1, the active region area and the sensitivity of the PV cell are provided by the associated product datasheets. The bandgaps are obtained from literature including the radiative recombination coefficient and the Auger coefficient for PV cells since they have negligible effects on the performance of such exemplary technology. The series resistances include resistances at both board level and package level (as in FIGS. 2A-2B), as well as resistances within the semiconductors (e.g., converter 1 and converter 1 as discussed above).

As discussed above and in connection with certain of the above experimental photonic transformers according to the present disclosure, certain performance improvements can be realized such as significantly reducing the series resistance to as small as 0.32 Ω·cm$^2$ by optimizing the PV cell design. Table 2 below provides some exemplary parameters for a modified photonic transformer, relative to the parameters used in Table 1.

TABLE 2

| | LED | PV |
|---|---|---|
| SRH lifetime (τ) | 16.7 µs | 35 ms |
| radiative recombination coefficient (B) | $7 \times 10^{-10}$ cm$^3$/s | same as in Table 1 |
| Auger coefficient (C) | $3.5 \times 10^{-30}$ cm$^6$/s | same as in Table 1 |
| series resistance (Rs) | same as in Table 1 | 0.32 Ω cm$^2$ |
| LED light extraction efficiency (ηEXT)/PV EQE (ηRES) | 0.8 | same as in Table 1 |
| view factor fLED->PV | 1 | |

The LED and PV parameters may be obtained from the literature (e.g., references 41 and 42 as listed in the above-referenced U.S. Provisional Application), and with the light extraction efficiency obtained from the product sheet of a high-efficiency infrared 850 nm LED (e.g., Osram LZ1-00R402).

It is recognized and appreciated that as specific examples, the above-characterized figures and discussion are provided to help illustrate certain advantages and aspects in some instances. As examples, according to the present disclosure, LED-based light sources are used to realize several advantages in example voltage conversion configurations. For example, from an implementation perspective, an LED is much simpler and cheaper to fabricate as compared to a laser, as the former does not require a cavity. Furthermore, LED-based transformer designs according to the present disclosure are much more robust in terms of operation, with the transformer designs leveraging on the temperature-related aspects including as examples, thermodynamic aspects such as the ultimate efficiency of an LED which is also higher than that of a laser, and electroluminescent efficiencies of an LED which can approach and in certain instances exceed 100%. By using the LED's ability to operate as a heat engine, light is generated from the thermal energy of its environment. Because the efficiency of a laser is to be below 100%, the efficiency of LED-based voltage transformers according to the present disclosure may reach higher values as compared with that of a laser-based transformer.

Such structures and devices include the exemplary structures and devices described in connection with each of the figures as well as other devices, as each such described embodiment has one or more related aspects which may be modified and/or combined with the other such devices and examples as described hereinabove may also be found in the Appendices of the above-referenced U.S. Provisional Application.

The skilled artisan would recognize various terminology as used in the present disclosure. As an example and as noted above, a PV (photovoltaic) device includes or refers to structure having one or more PV cells, each of which includes at least one active PV material capable of responding to exposure of light by generating an electric potential to deliver electric current to contacts. In connection with many of the examples provided above, application uses might be recognized as including but not limited to thin-film PV devices/materials which have an ability to absorb light in relatively thin layers such as thin layers and/or flexible layers formed using common layer/material deposition steps or processes as used in traditional semiconductor manufacturing. Further examples of such terminology are provided by the Specification which may describe and/or illustrates aspects useful for implementing the examples by way of various semiconductor materials/circuits which may be illustrated as or using terms such as layers, blocks, modules, device, system, unit, controller, and/or other circuit-type depictions. Also, in connection with such descriptions, such semiconductor and/or semiconductive materials (including portions of semiconductor structure) and circuit elements and/or related circuitry may be used together with other elements to exemplify how certain examples may be carried out in the form or structures, steps, functions, operations, activities, etc. It would also be appreciated that terms to exemplify orientation, such as upper/lower, left/right, top/bottom and above/below, may be used herein to refer to relative positions of elements as shown in the figures. It should be understood that the terminology is used for notational convenience only and that in actual use the disclosed structures may be oriented different from the orientation shown in the figures.

Based upon the above discussion and illustrations, those skilled in the art will readily recognize that various modifications and changes may be made to the various embodiments without strictly following the exemplary embodiments and applications illustrated and described herein. For example, methods as exemplified in the Figures may involve steps carried out in various orders, with one or more aspects of the embodiments herein retained, or may involve fewer or more steps. Such modifications do not depart from the true spirit and scope of various aspects of the disclosure, including aspects set forth in the claims.

What is claimed:

1. An apparatus comprising:
    a photon emitter; and
    a photo-voltaic device arranged relative to the photon emitter to provide index-matched optical coupling between the photo-voltaic device and the photon emitter for an emission wavelength range of the photon emitter.

2. The apparatus of claim 1, further including a material in a layer ("material layer") between the photo-voltaic device and the photon emitter, the material layer characterized as contributing to an index-matched optical coupling between the photo-voltaic device and the photon emitter, and wherein the material layer is predominantly transparent in the emission wavelength range of the photon emitter.

3. The apparatus of claim 1, wherein the photon emitter and the photo-voltaic device are arranged as a photonic transformer to realize DC voltage conversion.

4. The apparatus of claim 1, wherein the photon emitter and the photo-voltaic device are configured to realize DC voltage conversion through photon-emission and reabsorption processes.

5. The apparatus of claim 1, further including an integrated circuit in which the photon emitter and the photo-voltaic device are to operate, wherein the photon emitter refers to or includes at least one light-emitting diode (LED), further including an index matching material being located between the photon emitter and the photo-voltaic device, the index matching material being at least predominantly transparent in the emission wavelength range of the at least one LED, and wherein the photo-voltaic device includes a plurality of photo-voltaic cells arranged adjacent to one another along a plane oriented parallel to a layer which includes the index matching material.

6. The apparatus of claim 1, further including a monolithic integrated-circuit chip including the photon emitter, a spacer material and the photo-voltaic device, wherein the photon emitter refers to or includes a light-emitting diode (LED) circuit, and wherein the spacer material includes an index matching material that is essentially or substantially transparent in the emission wavelength range of the LED circuit.

7. The apparatus of claim 6, wherein the spacer material includes a first material that is transparent in the emission wavelength range of a second material used in the photon emitter, wherein each of the first material and the second material are part of a materials system as characterized by similar or corresponding refractive indexes associated with each of the first material and second material.

8. An apparatus comprising:
    a photon emitter to operate over an emission wavelength range;
    a photo-voltaic device; and
    a spacer material, located between the photon emitter and the photo-voltaic device, to optically couple the photon emitter and one or more cells of the photo-voltaic device, wherein the spacer material is predominantly transparent in the emission wavelength range of the photon emitter.

9. The apparatus of claim 8, wherein the photon emitter and the photo-voltaic device are arranged as a photonic transformer to realize DC voltage conversion.

10. The apparatus of claim 8, wherein the photon emitter and the photo-voltaic device are configured as a photonic transformer, and in operation the photonic transformer is to realize DC voltage conversion based on light emitted from the photon emitter.

11. The apparatus of claim 8, wherein the photon emitter and the photo-voltaic device are configured to realize DC voltage conversion through photon-emission and reabsorption processes.

12. The apparatus of claim 8, wherein the spacer material includes a first material that is transparent in the emission wavelength range of a second material used in the photon emitter, and wherein the first material and the second material are characterized by one of the following: the first and second materials refer to or include AlGaN and GaN; the first and second materials refer to or include InP and InGaAs; and the first and second materials refer to or include AlGaAs and GaAs.

13. The apparatus of claim 8, wherein the spacer material is configured as a layer, the layer including a first material that is among different materials in a materials system each of said different materials characterized by a similar or corresponding refractive index, wherein the first material is related to another material that is not among the different materials in the materials system in that the first material is essentially or substantially transparent in the emission wavelength range of the other material and in that the first material and the other material are related by way of a similar or corresponding refractive index.

14. The apparatus of claim 13, wherein the materials system includes at least one of the following sets of different materials: (a) AlGaN and GaN; (b) InP and InGaAs; and (c) AlGaAs and GaAs.

15. The apparatus of claim 8, wherein at least one of the photon emitter and the photo-voltaic cell includes at least one of the following materials: GaN; AlGaN; InGaAs; InP; GaAs; and AlGaAs.

16. The apparatus of claim 8, wherein the photon emitter and the photo-voltaic device are cooperatively arranged to propagate photons in the emission wavelength range, for generating an electrical signal at an output port of the apparatus.

17. A method comprising:
    with a photon emitter and a photo-voltaic device being spaced relative to one another for providing index-matched optical coupling for an emission wavelength range of the photon emitter, between the photo-voltaic device and the photon emitter, causing the photon emitter to emit photons and the photo-voltaic device to respond by generating electric current.

18. The method of claim 17, wherein the photon emitter and the photo-voltaic device are arranged as a photonic transformer which provides DC voltage conversion.

19. The method of claim 17, wherein the photon emitter and the photo-voltaic device are arranged as a photonic transformer which provides DC voltage conversion through photon-emission and reabsorption processes.

20. The method of claim 17, further including: using an index matching material between the photon emitter and the photo-voltaic device; and forming the photon emitter, the index matching material and the photo-voltaic device as part of an integrated circuit chip.

* * * * *